(12) United States Patent
Orio

(10) Patent No.: US 7,992,073 B2
(45) Date of Patent: Aug. 2, 2011

(54) DECODING DEVICE, DECODING METHOD, AND RECEIVING APPARATUS

(75) Inventor: Masao Orio, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 1309 days.

(21) Appl. No.: 11/590,823

(22) Filed: Nov. 1, 2006

(65) Prior Publication Data

US 2007/0124657 A1 May 31, 2007

(30) Foreign Application Priority Data

Nov. 16, 2005 (JP) .................................. 2005-331185

(51) Int. Cl.
*H03M 13/00* (2006.01)

(52) U.S. Cl. ......... 714/774; 714/752; 714/755; 714/758

(58) Field of Classification Search .................. 714/752, 714/755, 758, 774
See application file for complete search history.

(56) References Cited

U.S. PATENT DOCUMENTS

| | | | | |
|---|---|---|---|---|
| 7,260,762 | B2* | 8/2007 | Desai et al. ................... | 714/755 |
| 7,370,332 | B2* | 5/2008 | Kutz et al. ...................... | 714/780 |
| 7,565,594 | B2* | 7/2009 | Dominique et al. .......... | 714/755 |
| 2004/0006734 | A1* | 1/2004 | Shin et al. ..................... | 714/755 |
| 2004/0225941 | A1* | 11/2004 | Taffin ............................ | 714/755 |
| 2009/0019332 | A1* | 1/2009 | Hekstra et al. ................ | 714/752 |
| 2009/0094470 | A1* | 4/2009 | Gao et al. ...................... | 713/320 |
| 2009/0094503 | A1* | 4/2009 | Shin et al. ..................... | 714/755 |

FOREIGN PATENT DOCUMENTS

| | | |
|---|---|---|
| CN | 1406415 | 3/2003 |
| EP | 1 217 776 | 6/2002 |
| GB | 2 403 106 | 12/2004 |
| KR | 2004-96355 | 11/2004 |
| WO | WO 2005/064800 | 7/2005 |

OTHER PUBLICATIONS

Chinese Patent Office issued a Chinese Office Action dated Jun. 28, 2010, Application No. 200610149378.3.

* cited by examiner

*Primary Examiner* — Sam Rizk
(74) *Attorney, Agent, or Firm* — Young & Thompson

(57) ABSTRACT

A decoding apparatus includes a first decoder and a second decoder performing iterative decoding on each of a plurality of code blocks, each as a decoding unit, contained in a transport block, and a stop/end determination section determining whether or not to stop iterative decoding based on an output result from the second decoder. The stop/end determination section determines whether or not to stop the iterative decoding on each code block based on a determination result on whether error correction of iterative decoding in each code block is converted or not, and further determines whether or not to stop the iterative decoding of the transfer block based on the determination result in each code block. If it is determined that error correction of iterative decoding is not converted in one code block, the decoding process of the transport block containing the relevant code block is stopped.

16 Claims, 19 Drawing Sheets

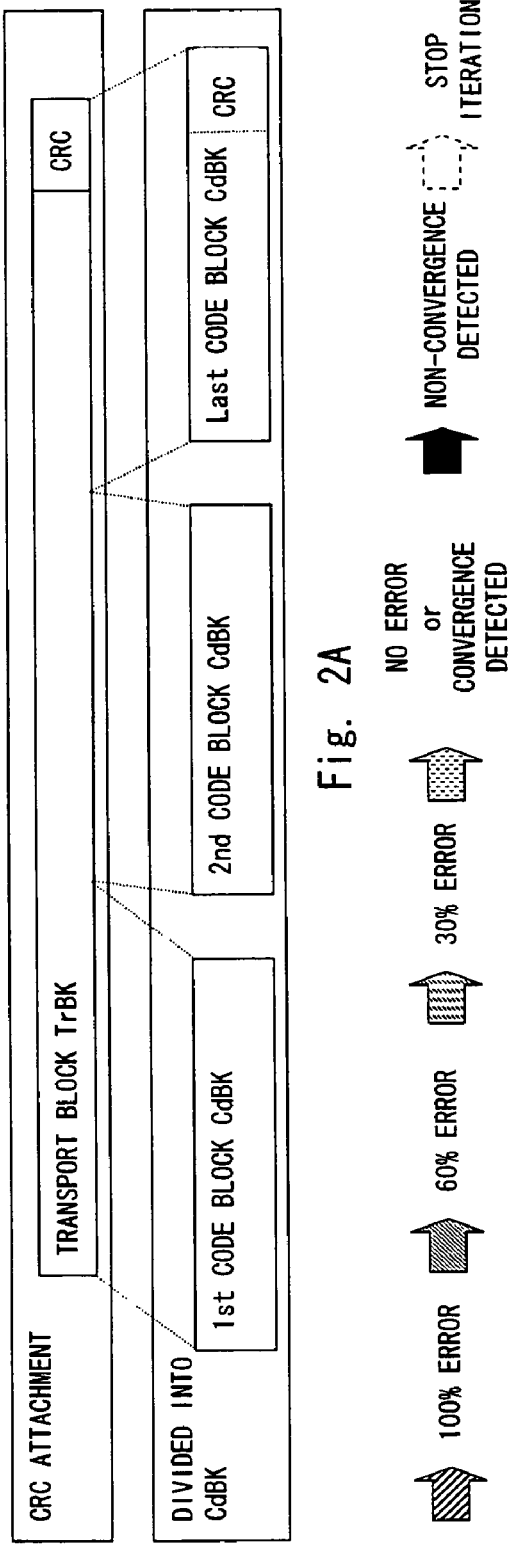
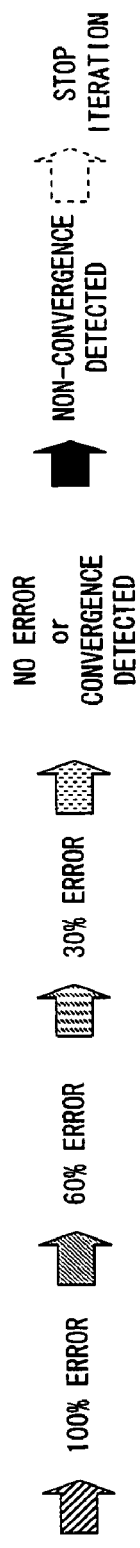
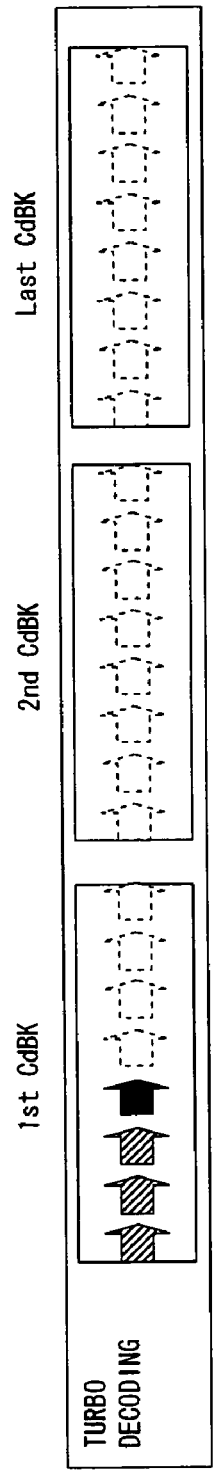
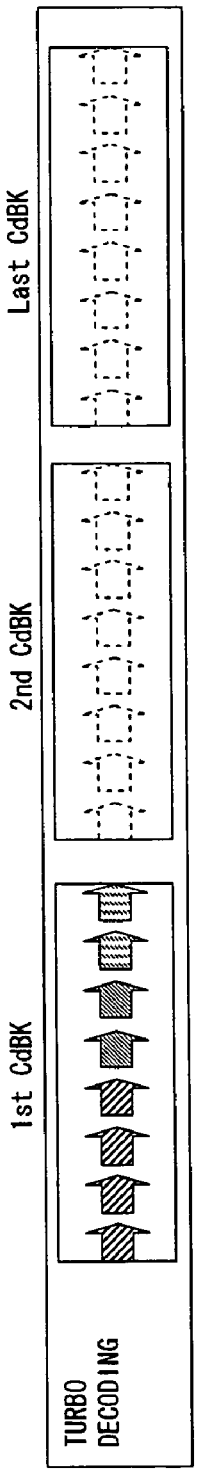
Fig. 2A
Fig. 2B
Fig. 2C

DECODING DEVICE, DECODING METHOD, AND RECEIVING APPARATUS

BACKGROUND OF THE INVENTION

1. Field of the Invention

The present invention relates to a decoding device, a decoding method, and a receiving apparatus which decode received data based on likelihood information and, particularly, to a decoding device, a decoding method, and a receiving apparatus which perform a decoding process with improved efficiency.

2. Description of Related Art

In a digital communication system, error correcting codes for correcting an error which occurs on a transmission line are used. Particularly in a mobile communication system where radio field intensity varies drastically due to fading and an error is likely to occur, a high correction capability is required for error correcting codes. Turbo codes, which are one example of error correcting codes, are notable as the codes having the error correction capability which is close to the Shannon limit and employed in the W-CDMA (Wideband Code Division Multiple Access) or CDMA-2000 as the third-generation mobile communication system, for example.

FIG. 12 is a block diagram showing the structure of a typical encoding device for generating turbo codes. The encoding device 101 may be placed on the transmitting side of a communication system in order to encode information bits (systematic bits: systematic portion) U as pre-encoded data into turbo codes as parallel concatenated convolutional codes (PCCCs) and output the turbo codes to outside such as a transmission line. The turbo codes are not limited to the parallel concatenated convolutional codes and may be any codes which can be turbo-decoded, such as serial concatenated convolutional codes.

The encoding device 101 includes a first encoder 102, a second encoder 103 which serve as a systematic convolutional coder, and an interleaver 104 which interleaves (i.e. rearranges) data as shown in FIG. 12.

The first encoder 102 encodes input systematic portion U to generate redundancy bits (hereinafter as "parity bits") 1P and outputs the parity bits 1P to outside. The interleaver 104 rearranges each bit of the input systematic portion U into a prescribed interleaved pattern to generate a systematic portion $U^{int}$ and outputs the generated systematic portion $U^{int}$ to the second encoder 103. The second encoder 103 encodes the systematic portion $U^{int}$ to generate parity bits 2P and outputs the parity bits 2P to outside.

In sum, the encoding device 101 generates the systematic portion U, the parity bits 1P, the systematic portion $U^{int}$, and the parity bits 2P. A pair of the systematic portion U and the parity bits 1P (U, P) is called a first elemental code E, and a pair of the systematic portion $U^{int}$ and the parity bits 2P ($U^{int}$, 2P) is called a second elemental code $E^{int}$.

Decoding such encoded turbo codes is called turbo decoding. In the turbo decoding process, decoding is performed repeatedly as a first decoder for decoding the first elemental code E and a second decoder for decoding the second elemental code $E^{int}$ exchange external information. The number of decoders is not limited to two, and two or more stages of decoders may be used in accordance with the number of elemental codes of the turbo codes.

Specifically, in the turbo decoding process, the parity bits 1P, channel values $Y_{1p}$ and $Y_s$ of the systematic portion U, and a predetermined value (external information) $L_{e2}$ are input to a first decoder as the first stage decoder to obtain external information $L_{e1}$. An initial value of the external information $L_{e2}$ is 0. In order to align the data sequence, the external information $L_{e1}$ is rearranged by an interleaver into external information $L^{int}_{e1}$ to be input to a second decoder as the second stage decoder.

Further, the channel value $Y_s$ is rearranged by an interleaver into $Y^{int}_s$. The channel value $Y_{2P}$ of the parity bits 2P and the interleaved $Y^{int}_s$ are input to the second decoder to obtain external information $L^{int}_{e2}$. These values are rearranged by a de-interleaver so that the data sequence is the same as the data from the first decoder to thereby obtain external information $L_{e2}$ for the first decoder. This is repeated a plurality of times.

In this way, the process decodes information by repeatedly exchanging reliability information of the first and second decoders each other i.e. using reliability information (external information $L_{e1}$) of the first decoder to enhance reliability information of the second decoder and using reliability information (external information $L_{e2}$) of the second decoder to enhance reliability information of the first decoder. Such iterative operation is called "turbo decoding" because it resembles a turbo engine of automobiles.

In such iterative decoding, it is critical when to stop the iterative decoding while maintaining a high decoding capability in order to reduce power consumption of a decoder and decoding time. Techniques for stopping the iterative decoding using various stop conditions are disclosed in Japanese Unexamined Patent Application Publications Nos. 2004-194326, 2002-344330, and 2002-100995.

As an example of stopping the iterative decoding, a method of stopping turbo decoding using HDA (Hard-Decision Aided) is described hereinafter. The HDA is a stopping method for an iterative process which uses a rate of bits which are "0"/"1" inverted from the previous iteration for HD (Hard Decision) in each iterative process in the turbo decoding. The smaller rate of inverted bits indicates that the decoding process is coming to convergence or an end. Originally, HDA is used in order to end the iterative decoding of turbo codes by detecting that no error occurs. For example, the turbo decoding process can be ended when a value of HDA falls below a prescribed threshold.

A decoding device which uses HDA not only for the detection of convergence but also for the detection of non-convergence in the decoding process to thereby optimize the number of times of iteration of turbo decoding is disclosed in A. Taffin, "Generalized stopping criterion for iterative decoders", IEEE Electronics Letters, 26 Jun. 2003, Vol. 39, No. 13. FIG. 13 is a block diagram which depicts a decoding device taught by Taffin. A decoding device 201 includes a first decoder 202, a second decoder 203, interleavers 204 and 205, de-interleavers 206 and 207, a hard decision section 208, and a HDA determination section 209.

The decoding device 201 receives turbo codes which are transmitted through a transmission line as received data. The received data contain the first elemental code E and the second elemental code $E^{int}$. The elemental codes E and $E^{int}$ are composed of parity bits 1P and 2P and systematic bits U and $U^{int}$ as described earlier. The systematic bits $U^{int}$ of the second elemental code $E^{int}$ can be obtained by inverleaving the systematic bits U of the first elemental code E. Thus, the actually transmitted data contain the systematic bits U and the parity bits 1P of the first elemental code E and the parity bits 2P of the second elemental code $E^{int}$.

The first decoder 202 and the second decoder 203 perform iterative decoding of the received data by soft-input soft-output decoding. SOVA (Soft-Output Viterbi Algorithm) and MAP (Maximum A Posteriori) are known as the soft-input soft-output decoding.

The first decoder 202 receives the received first elemental code E (first parity $Y_{1p}$, systematic bits $Y_s$) and external information $L_{e2}$, performs decoding, and outputs first external information $L_{e1}$. The interleaver (int) 204 interleaves the first external information $L_{e1}$ to generate interleaved first external information $L^{int}_{e1}$. At the same time, the interleaver 205 interleaves the systematic bits $Y_s$ to generate interleaved systematic bits $Y^{int}_s$, which is then supplied to the second decoder 203.

The second decoder 203 receives the interleaved first external information $L^{int}_{e1}$, the received second parity $Y_{2p}$, and the interleaved systematic bits $y^{int}_s$, performs decoding, and outputs second external information $L^{int}_{e2}$. The second external information $L^{int}_{e1}$ is then de-interleaved by the de-interleaver 206 and supplied to the first decoder 202. The first decoder 202 decodes the second external information $L_{e2}$. The above process is repeated subsequently. One-time iterative decoding ends upon completion of the decoding process in the first decoder 202 and the second decoder 203.

The second decoder 203 calculates logarithmic likelihood ratio $L^{int}_2$ and outputs it to the de-interleaver 207. The de-interleaver 207 de-interleaves the logarithmic likelihood ratio $L^{int}_2$ into logarithmic likelihood ratio $L_2$, and then the hard decision section 208 determines a hard decision result. In the decoding device 201, the hard decision result is supplied to the HDA determination section 209, which then determines whether or not to stop the iterative process of turbo decoding.

The HDA determination section 209 compares the BER which is calculated by HDA and the information length rate with thresholds and determines convergence/non-convergence of turbo codes to thereby optimize the iterative number of turbo decoding.

FIG. 14 is a flowchart showing a decoding method in the decoding device 201. As shown in FIG. 14, the number of times of iterative decoding to be performed in the first decoder 202 and the second decoder 203, which is referred to hereinafter as the iterative number, is set to 1, and an upper limit of the iterative number is set to 8 (Step S101). Then, the first decoder 202 performs decoding to generate first external information $L_{e1}$ (Step S102). The interleaver 204 interleaves the first external information $L_{e1}$ and supplies the result to the second decoder 203. At the same time, the interleaver 205 interleaves the systematic bits $Y_s$ and supplies the result to the second decoder 203. Although the first decoder 202 also generates a logarithmic likelihood ratio (LLR) $L_1$, it is not used herein. An initial value of an input $L_{e2}$ to the first decoder 202 is 0.

The second decoder 203 outputs the interleaved second external information $L^{int}_{e2}$ and the interleaved logarithmic likelihood ratio $L^{int}_2$. The interleaved second external information $L^{int}_{e2}$ is de-interleaved by the de-interleaver 206 into second external information $L_{e2}$ to be input to the first decoder 202. The interleaved logarithmic likelihood ratio $L^{int}_2$ is de-interleaved by the de-interleaver 207 into logarithmic likelihood ratio $L_2$ and then input to the hard decision section 208 where a hard decision result is generated.

After that, it is determined whether the iterative number exceeds 1 or not (Step S104) and, if the iterative number is equal to or more than 2, a determination value $\Delta_0$ is calculated as the following Expression 1 (Step S105).

$$\Delta_0 = \frac{1}{N} \sum_{k=0}^{N-1} |\hat{u}_k(L_2^i) - \hat{u}_k(L_2^{i-1})| \qquad (1)$$

where k indicates a bit identifier in block, i indicates an iterative number, N indicates a block length, $\hat{u}()$ indicates a hard decision result, $L_2$ indicates a logarithmic likelihood ratio LLR of the second decoder, and $\Delta_0$ indicates a ratio of differences in hard decision results.

Thus, the determination value $\Delta_0$ indicates a ratio of differences between a hard decision result of the current logarithmic likelihood ratio $L_2$ and a hard decision result of the previous logarithmic likelihood ratio $L_2$ for each bit. If the determination value $\Delta_0$ approximates 0, the current and previous decoding results are equal. If the determination value $\Delta_0$ approximates 1, the current and previous decoding results differ largely.

If the determination value $\Delta_0$ is larger than a convergence determining threshold $\eta_{conv}$ or smaller than a non-convergence determining threshold $\eta_{non-conv}$ (No in Step S106), the iterative decoding is performed until the iterative number reaches MAX=8. Thus, the process determines whether or not the iterative number reaches MAX=8 (Step S107) and, if it is less than 8, it increments the iterative number (Step S108) and repeats the procedure from Step S102.

For the determination of the determination value $\Delta_0$ in Step S106, when the iterative number is 2 or above, the determination value $\Delta_0$ is calculated by Expression 1 using a hard decision result û. Then, a stopping criteria is determined from the convergence determining threshold $\eta_{conv}$ and the non-convergence determining threshold $\eta_{non-conv}$. If the determination results in that either of convergence/non-convergence condition is satisfied, the iterative decoding is stopped.

Advantages of such a conventional decoding device which controls the stopping of the iterative decoding using the non-convergence determination in addition to the convergence determination are described below. FIG. 15 is a graph showing the relationship between a noise and an error rate. The vertical axis indicates a block error rate (BLER) and a bit error rate (BER). The horizontal axis indicates a signal-to-noise power density ratio $E_b/N_0$ (dB). FIG. 16 is a view showing the relationship of the iterative number with respect to a signal-to-noise power density ratio.

In FIGS. 15 and 16, the signal-to-noise power density ratio $E_b/N_0$ (dB) in the horizontal axis is such that a larger value indicates a smaller noise. The BLER in the vertical axis is calculated by counting a block which contains one or more bit error as an error, and BER indicates a value (%) that is a result of dividing the number of error bits by 954 bits (encoding block size).

In FIG. 16, (OFF, OFF) indicates the case where convergence or non-convergence is not performed, and (2%, OFF) indicates the case where the iterative stop control is performed only by the convergence determination with the convergence determining threshold $\eta_{conv}$=2%. (OFF, 20%) indicates the case where the iterative stop control is performed only by the non-convergence determination with the non-convergence determining threshold $\eta_{non-conv}$=20%, and (2%, 20%) indicates the case where iterative stop control is performed by the convergence/non-convergence determination with the convergence determining threshold $\eta_{conv}$=2% and the non-convergence determining threshold $\eta_{non-conv}$=20%.

The simulation conditions are as follows. The transmitting-side conditions involve the Rate 1/3(15, 13)$_8$ PCCC turbo encoder, the 2-stage rate-matching, and the parallel bit level channel interleaver. The modulation method is the 16QAM constellation and the conventional Gray mapping. The code block size is fixed to 954 bits (938 systematic bits and 16 CRC bits). The parity bits are ½ punctured. Thus, 1920 bits are transmitted at intervals of 2 ms. The fading condition is 50 km/h on a single path. The receiving-side conditions involves no RAKE synthesis due to the single path, soft-output of Max-Log-MAP, and the maximum iterative number of 8 times, and Hybrid-ARQ being invalid.

Under the above conditions, BLER and BER are smaller as a noise is lower as shown in FIG. 15. Further, the iterative number is smaller as the noise is lower as shown in FIG. 16. Where BLER=10% ($E_b/N_0$=16 dB), an average iterative number is about 2.25. This reduces more than 70% of processing compared with the case where the iterative number is fixed to 8. With the convergence determination at a threshold of 2%, an average iterative number is about 2.8. Therefore, the stop control with convergence/non-convergence determination leads to about 20% reduction of processing compared with the stop control with convergence determination only.

Although a conventional decoding device is described above by way of illustration, various iterative control methods are proposed as described in the above-described patent documents and Taffin. FIG. 17 shows the summary of these techniques. FIG. 17 is a view depicting the iterative control methods and the number of iterations according to several related arts. The iterative control method employed in the decoding device taught by Taffin corresponds to the related art D. This iterative control method is an improved version of the iterative control method corresponding to the related art C below. The correspondence in FIG. 17 is as follows.

Related art A: Where the iterative number is fixed (e.g. 8 times)
 A1: The decoding is iterated 8 times if an error cannot be corrected after completing 8 times of iteration.
 A2: The decoding is iterated until reaching a fixed upper limit (8 times) even if an error is corrected before completing 8 times of iteration.

Related art B: Where the determination whether an error exists or not is performed using error detecting codes until reaching a maximum iterative number (e.g. 8 times) and the iterative process is stopped if there is no error.
 B1: When there is no error detecting code, decoding is iterated 8 times if an error cannot be corrected after completing 8 times of iteration (=A1).
 B2: When there is no error detecting code, decoding is iterated 8 times even if an error is corrected before completing 8 times of iteration.
 B3: When there are error detecting codes, decoding is iterated 8 times if an error cannot be corrected after completing 8 times of iteration.
 B4: When there are error detecting codes, iterative process is stopped if an error is corrected before completing 8 times of iteration.

Related art C: Where the determination on convergence of error correction is performed until reaching a maximum iterative number (e.g. 8 times) and the iterative decoding is stopped if it is determined that the error correction is converged.
 C1: The decoding is iterated 8 times if convergence of error correction is not detected after completing 8 times of iteration.
 C2: The iterative process is stopped if convergence of error correction is detected before completing 8 times of iteration.

Related art D: Where determination on non-convergence of error correction is added to the above case C, and the iterative decoding is stopped if it is determined that the error correction is not converged even after reaching a maximum iterative number.
 D1: The decoding is iterated 8 times if convergence/non-convergence of error correction is not detected after completing 8 times of iteration.
 D2: The iterative process is stopped if non-convergence of error correction is detected before completing 8 times of iteration.
 D3: The iterative process is stopped if convergence of error correction is detected before completing 8 times of iteration.

As described in the foregoing, the related art D corresponding to the decoding device taught by Taffin overcomes the drawback in the related art C, that is, the decoding is undesirably iterated 8 times even if the error correction is not converged even after completing 8 times of iteration (the case C1). By performing the determination on non-convergence in addition to the determination on convergence, the iterative process can be stopped if non-convergence is determined before reaching a maximum iterative number of 8 times as shown in D2 of the related art D. This prevents unnecessary iterative process. The use of convergence/non-convergence determination enables the iterative control of turbo codes to thereby optimize the iterative number.

The W-CDMA or the like is a transmission method which is standardized by 3 GPP (3rd Generation Partnership Project). The 3 GPP is working on the standardization of the third-generation mobile communication system.

HSDPA (High Speed Downlink Packet Access), which is one of high-speed packet transmission technology, is defined by the 3 GPP. The HSDPA employs adaptive modulation which comprehensively checks a varying condition of a radio wave propagation path or a change in the velocity of propagation of a radio wave in the air and automatically selects an optimum modulation order. Specifically, the low-rate QPSK (Quadrature Phase Shift Keying) is used when the receiving condition of a ratio wave is not good and the high-rate 16 QAM (16 Quadrature Amplitude Modulation) is used when the receiving condition of a ratio wave is good. Each has the strength against a noise which is opposed to the rate, and the QPSK is low rate because of a large overhead and the 16 QAM enables high-speed transmission.

According to the HSDPA, the number of transport block (TrBK) is regulated to one. At the end of the transport block TrBK, 24-bit CRC is added as an error detecting code. Further, the block size of a code block (CdBK) is regulated to 5114 bits at maximum. The code block CdBK is a unit block for turbo coding.

Accordingly, if TrBK+CRC5114, TrBK+CRC is divided into a plurality of CdBK. According to the HSDPA, there are several categories in accordance with a transfer rate, and a maximum TrBK size is predetermined depending on the category. For example, a TrBK can contain up to two code blocks CdBK in the categories 5 and 6, up to three code blocks CdBK in the categories 7 and 8, and up to six code blocks CdBK in the category 10. Consequently, a CRC as an error correcting code is added at the end of a final CdBK, and no error correcting code is added at code blocks CdBK in the middle.

Application of the above related arts A to D to the case of performing turbo-decoding on such a transport block TrBK is as follows. In terms of optimizing the iterative number, the related art A which always performs iterative decoding until reaching a maximum iterative number is not suitable. Because an error detecting code is added only to a final code block CdBK, the related art B cannot be applied. Further, because the determination on non-convergence is not performed in the related art C, iterative decoding is undesirably performed until reaching a maximum iterative number even if it is non-convergence. Thus, the application of the related art D which performs the determination on non-convergence in addition to the determination on the convergence is examined hereinafter.

FIG. 18 is a schematic view to describe a decoding method according to the HSDPA which is applied to the related art D (Taffin). FIG. 19 is a flowchart showing the decoding method according to the related art D. For simplification of description, the number of code blocks CdBK is three as shown in FIG. 19. Specifically, a transport block TrBK is composed of three code blocks, a 1st code block CdBK, a 2nd code block CdBK, and a Last code block CdBK. An error correcting code CRC is added to the end of the transport block TrBK, which is at the Last code block CdBK.

Further, in this example, the number of turbo decoder is one, and non-convergence of error correction is detected in the fourth iterative step in each code block CdBK. Because it is necessary in the transport block TrBK to perform error detection using the CRC which is added to the Last code block CdBK, the code blocks CdBK should be processed in the order of receipt. In order to determine non-convergence under the above conditions, the method according to the related art D detects non-convergence of error correction in the fourth iterative step in each code block CdBK to thereby stop the iterative process.

The method according to the related art C, under the same conditions, requires total 24 times of iterative decoding, 8 (i.e. a maximum iterative number) times for each of all the code blocks CdBK. On the other hand, the method according to the related art D requires only total 12 times of iterative decoding under the above conditions by employing the detection on non-convergence.

However, in the example shown in FIG. 18, it is obvious at the point when non-convergence is detected at the 1st code block CdBK that the CRC determination in this transport block TrBK would detect an error. In such a case, there should be no need to perform any decoding process in the subsequent code blocks CdBK. Therefore, the total 8 times of iterative decoding in the 2nd code block CdBK and the Last code block CdBK are unnecessary process.

Specifically, as shown in FIG. 19, the method of processing the transport block according to the related art D initializes the code block No=1 and the number of code blocks=3 in Step S201, and performs turbo decoding on the 1st code block CdBK (Step S202). The turbo decoding is the process shown in FIG. 14. More specifically, the process calculates a determination value $\Delta_0$ in the code block CdBK and, upon detection of convergence or non-convergence, continues to perform decoding until reaching a maximum iterative number (=8). In the above example, the process detects the non-convergence at the fourth iterative step and ends the iterative decoding of the code block CdBK. The process then proceeds to Step S203 and undesirably repeats Steps S202 and S203 until completing the final code block Last CdBK even if non-convergence is detected in Step S202.

FIGS. 20A and 20B are views to describe the drawback of the related art D. As shown in FIG. 20A, the decoding method of the related art D does not stop processing the code block CdBK until the number of decoded blocks CdBK reaches the Max number, 3. Therefore, the process undesirably performs the iterative decoding in the subsequent 2nd code block CdBK and the Last code block CdBK. Further, if either of convergence or non-convergence is not detected in any code block CdBK as shown in FIG. 20B, the process can perform processing until a maximum iterative number is reached in all the code blocks CDBK, which results in useless iterative decoding.

SUMMARY OF THE INVENTION

According to an aspect of the present invention, there is provided a decoding device that decodes received data based on likelihood information, which includes a decoding processor performing iterative decoding on each of a plurality of blocks divided from the received data, and a stop/end determination section determining whether or not to stop the iterative decoding based on an output result from the decoding processor. The stop/end determination section performs stop determination for determining whether or not to stop the iterative decoding in each divided block and performs end determination for determining whether or not to end decoding process of the received data based on a stop determination result.

According to another aspect of the present invention, there is provided a decoding method that decodes received data based on likelihood information, which includes outputting a decoding result after performing decoding in one divided block of a plurality of blocks divided from the received data, performing stop determination for determining whether or not to stop iteration of decoding in the one divided block based on the decoding result, and iterating decoding if not stopping decoding in the one divided block, and performing end determination for determining whether or not to end decoding process of the received data based on a result of the stop determination if stopping decoding in the one divided block.

Because the present invention performs stop determination for determining whether or not to stop iterative decoding on each of a plurality of blocks divided from received data and further performs end determination for determining whether or not to end decoding process of the received data based on a stop determination result, the end determination of the decoding process of the received data can be performed during processing the receive data, thereby eliminating unnecessary processing.

The present invention provides a decoding device, a decoding method, and a receiving apparatus which eliminate unnecessary iterative decoding to enable an efficient decoding process.

BRIEF DESCRIPTION OF THE DRAWINGS

The above and other objects, advantages and features of the present invention will be more apparent from the following description taken in conjunction with the accompanying drawings, in which:

FIG. 2A is a schematic view to describe a transport block as received data in the first embodiment of the present invention;

FIG. 2B is a schematic view showing a case where non-convergence is detected from the received data;

FIG. 2C is a schematic view showing a case where convergence is not detected from the received data during decoding up to a maximum iterative decoding number;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary embodiments of the present invention are described hereinafter with reference to the accompanying drawings. In the following embodiments, the present invention is applied to a decoding device which receives packets compliant to the HSDPA standard and performs turbo decoding thereon, and a receiving apparatus including the same. The decoding device of the embodiments end the decoding of a transport block if the transport block contains a code block where error correction would not be converged as a result of iterative decoding, thereby preventing performing useless iterative decoding. Although the decoding device which receives packets compliant to the HSDPA standard and performs turbo decoding thereon is described in the following embodiments by way of illustration, the present invention may be applied with equal effects to any decoding device in which received data are divided into a plurality of blocks and iterative decoding is performed thereon as described later.

First Embodiment

Figure 1:
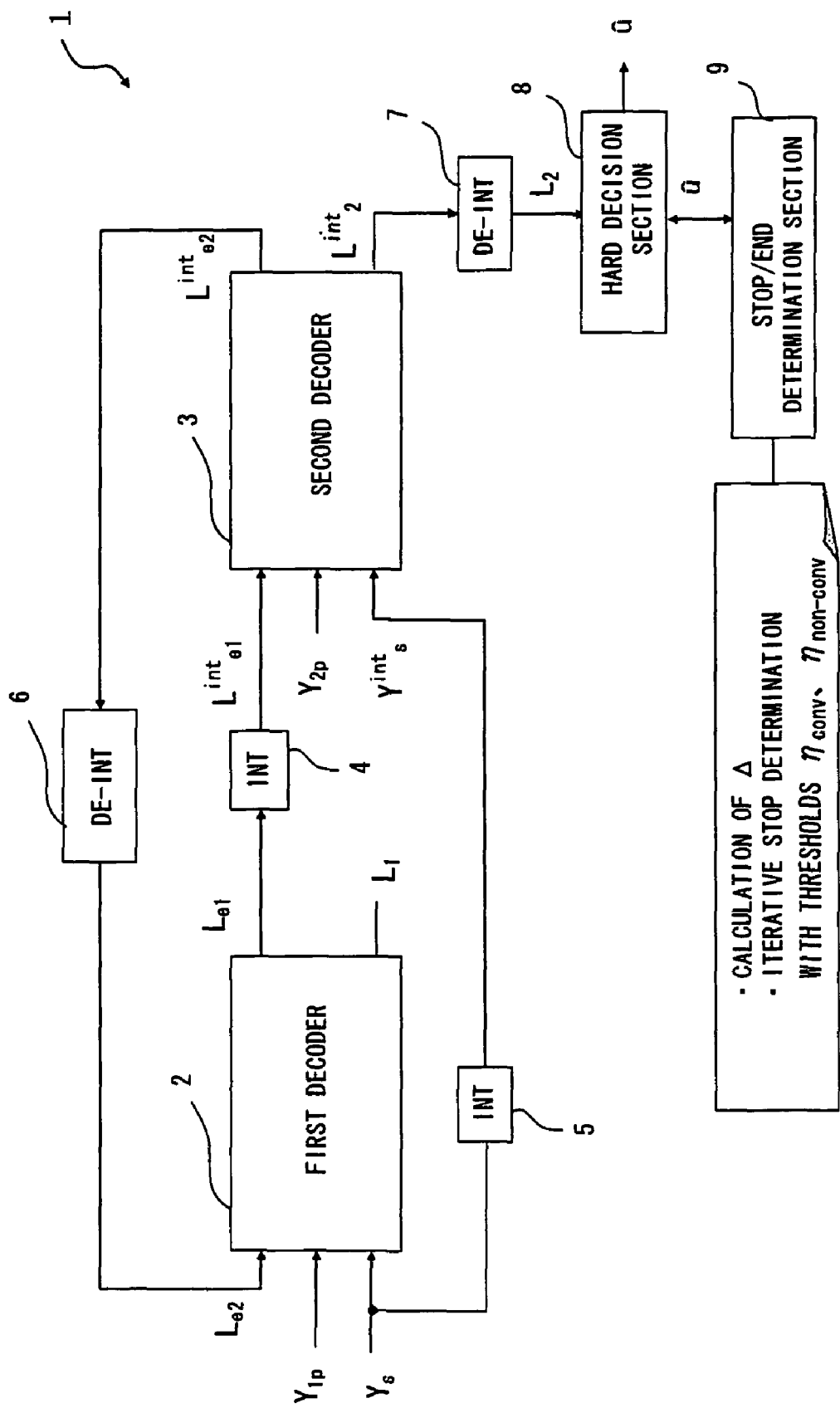
FIG. 1 is a view showing a decoding device according to a first embodiment of the present invention.

FIG. 1 is a view showing a decoding device 1 according to a first embodiment of the present invention. The decoding device 1 includes a first decoder 2, a second decoder 3, interleavers 4 and 5, de-interleavers 6 and 7, a hard decision section 8, and a stop/end determination section 9.

Figure 12:
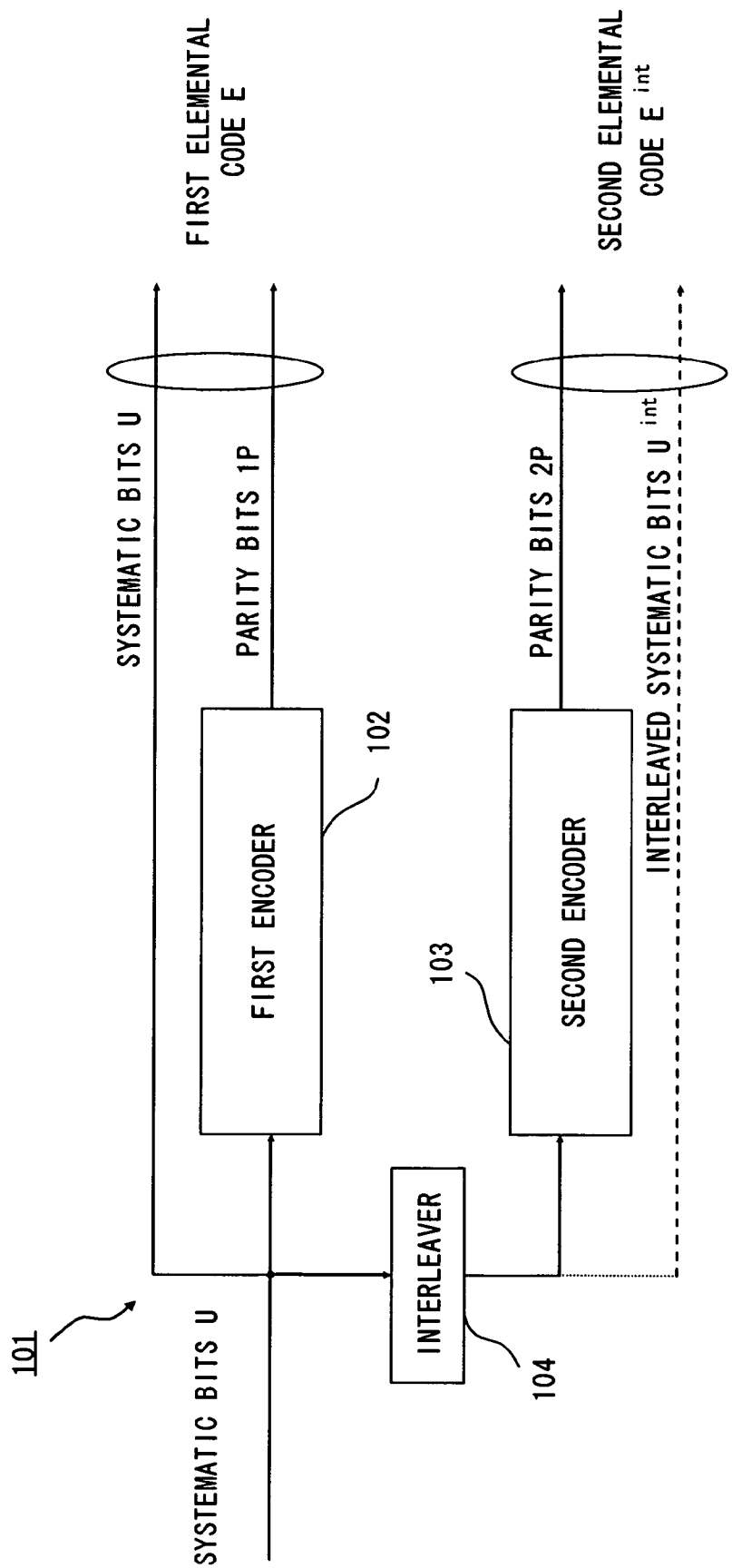
FIG. 12 is a view showing the structure of a typical encoding device for generating turbo codes.
Figure 13:
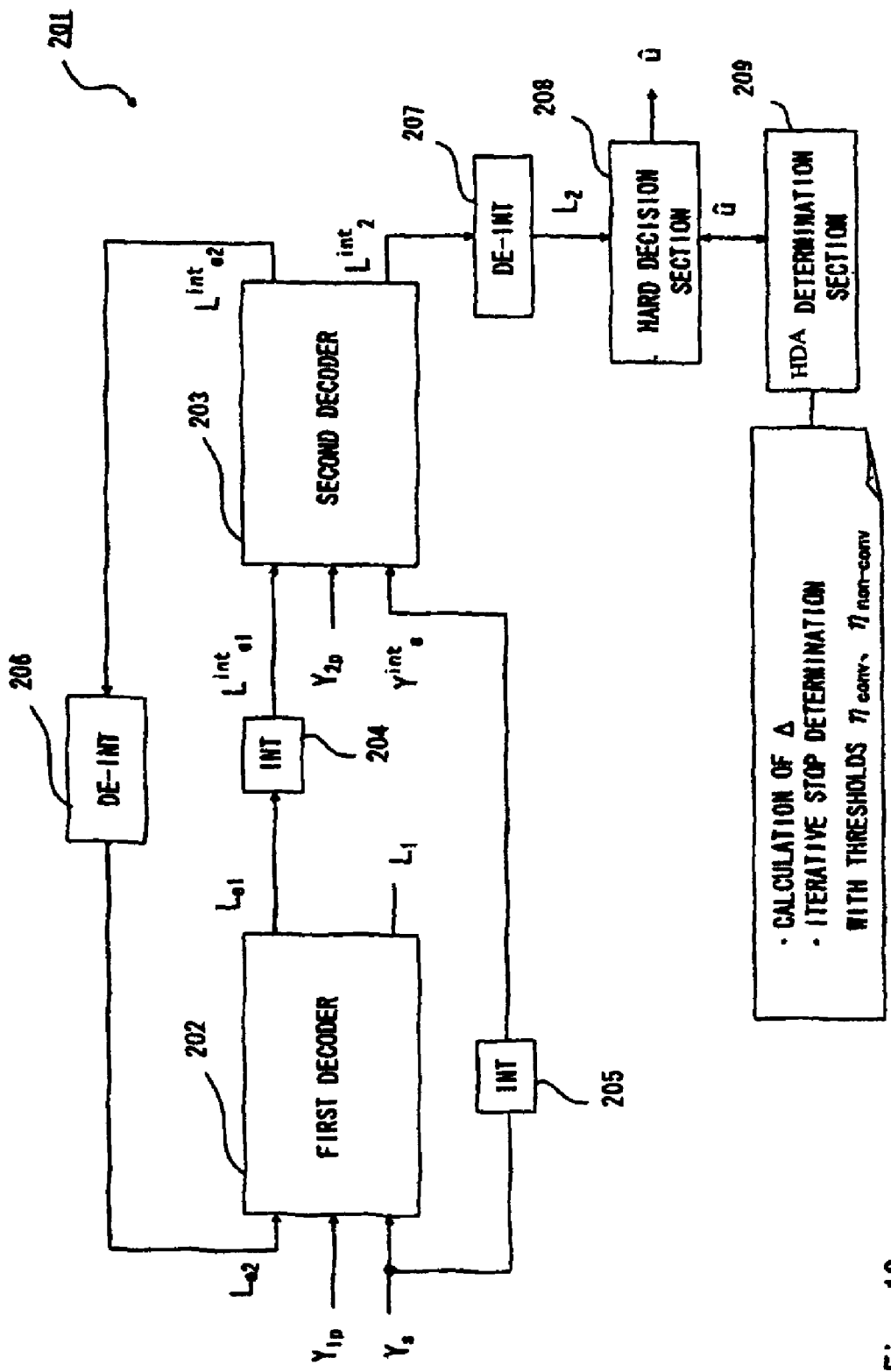
FIG. 13 is a block diagram showing a decoding device according to a related art.
Figure 14:
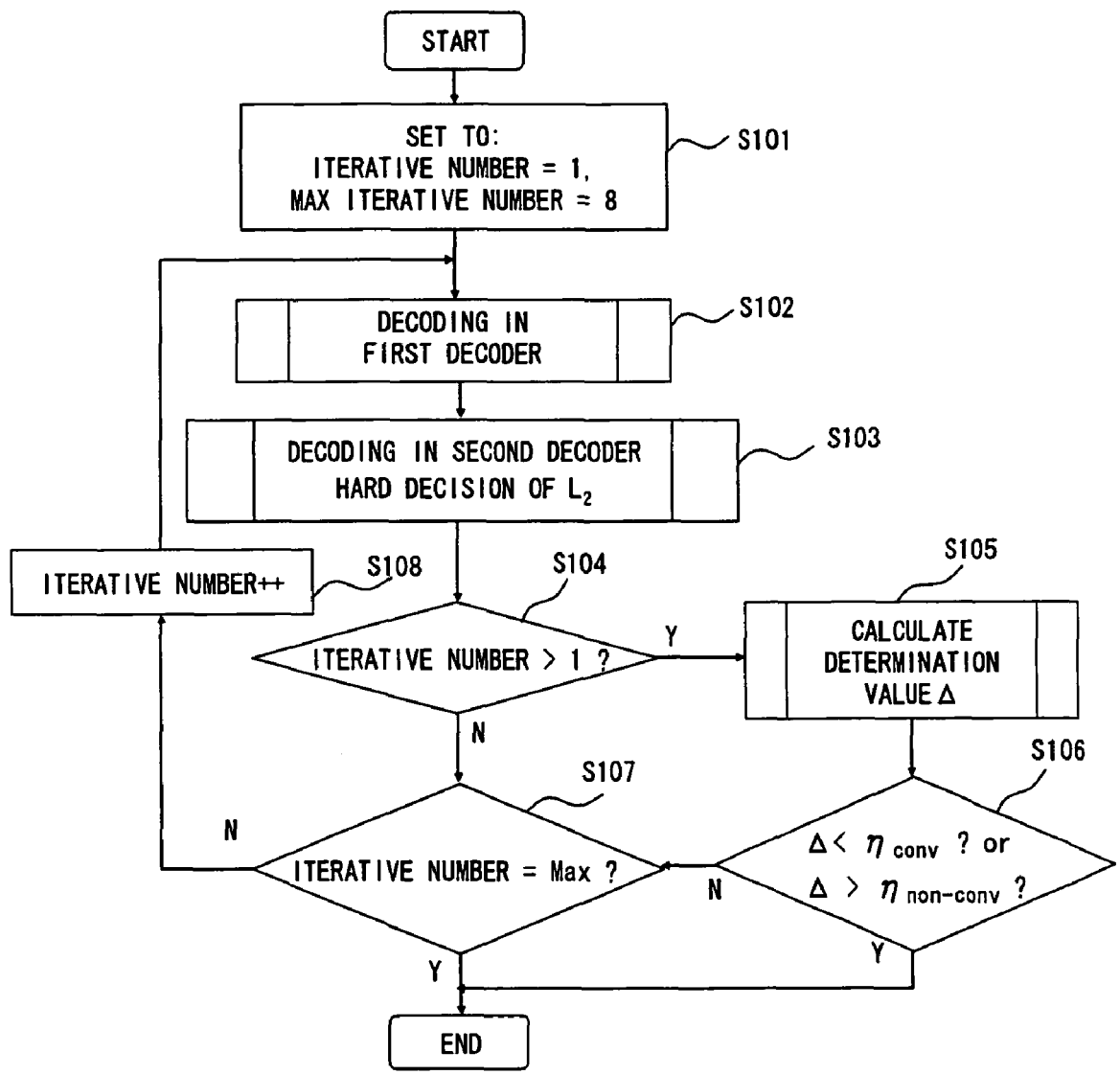
FIG. 14 is a flowchart showing a decoding method for a decoding device according to a related art.
Figure 15:
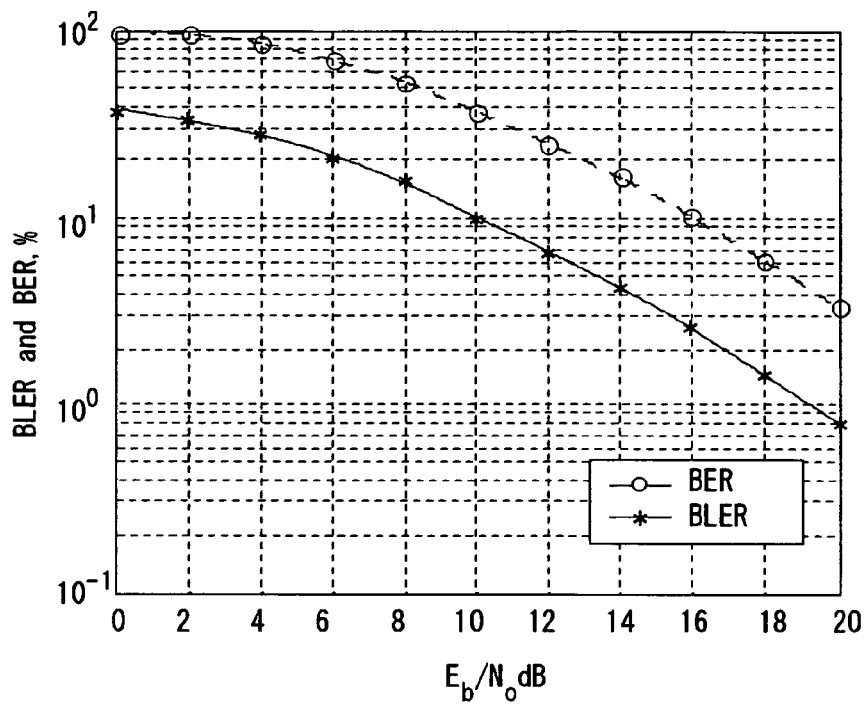
FIG. 15 is a graph showing the relationship between a noise and an error rate in a decoding device according to a related art, with the vertical axis indicating a block error rate (BLER) and a bit error rate (BER) and the horizontal axis indicating an error rate.
Figure 16:
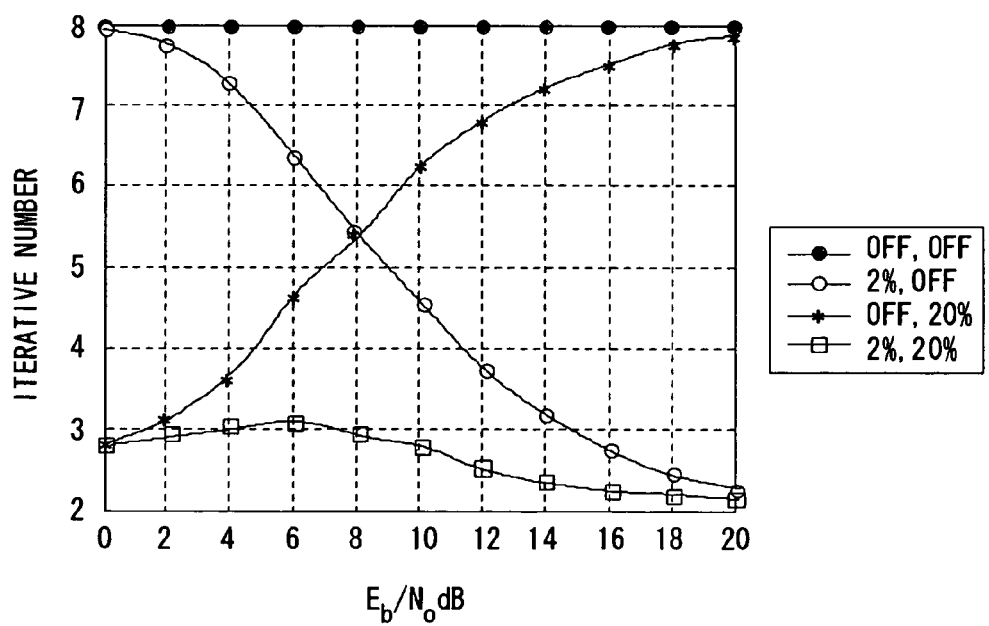
FIG. 16 is a graph showing the relationship between a noise and an iterative number in a decoding device according to a related art.
Figure 17:
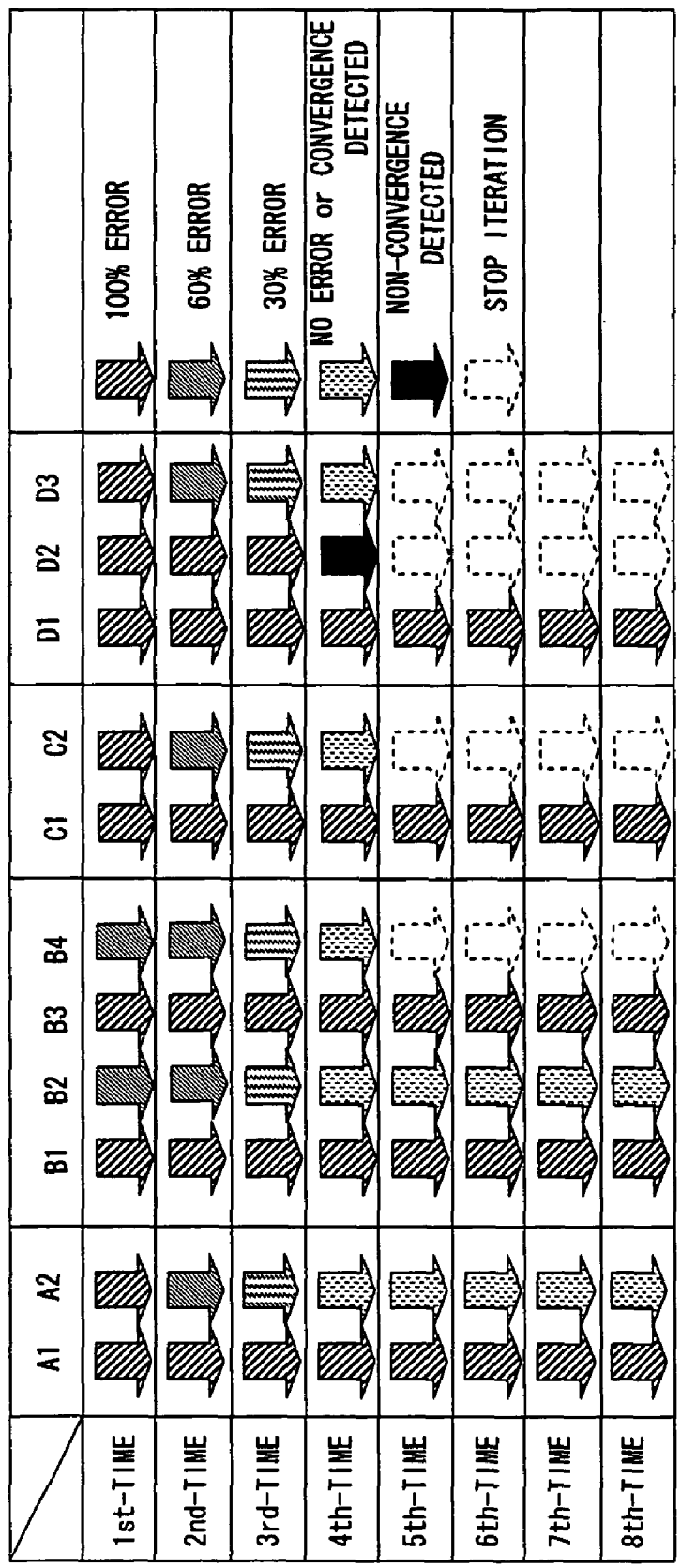
FIG. 17 is a view showing an iterative control method and an iterative number according to a related art.
Figure 18:
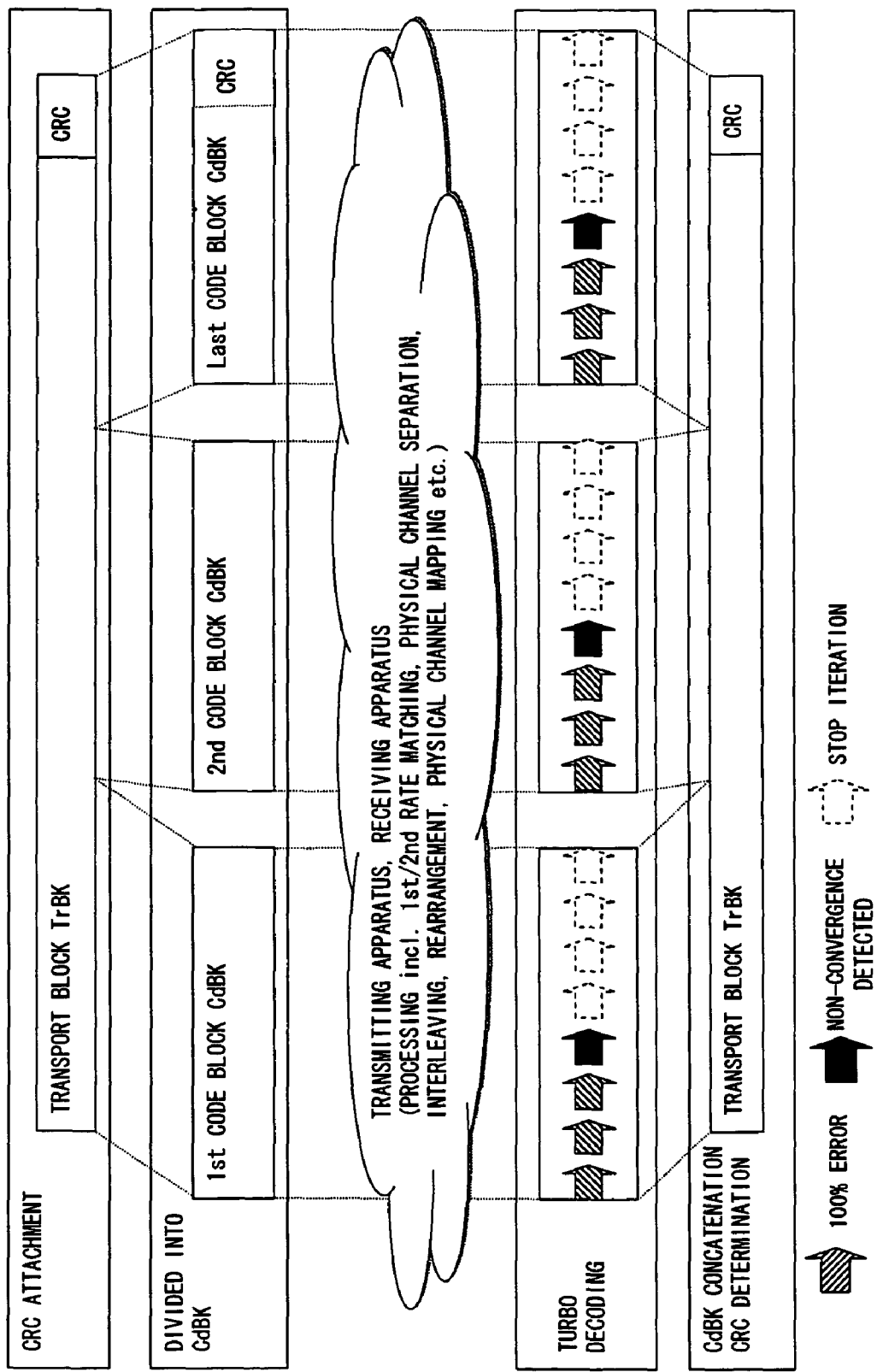
FIG. 18 is a schematic view to describe a decoding method in HSDPA according to a related art D.
Figure 19:
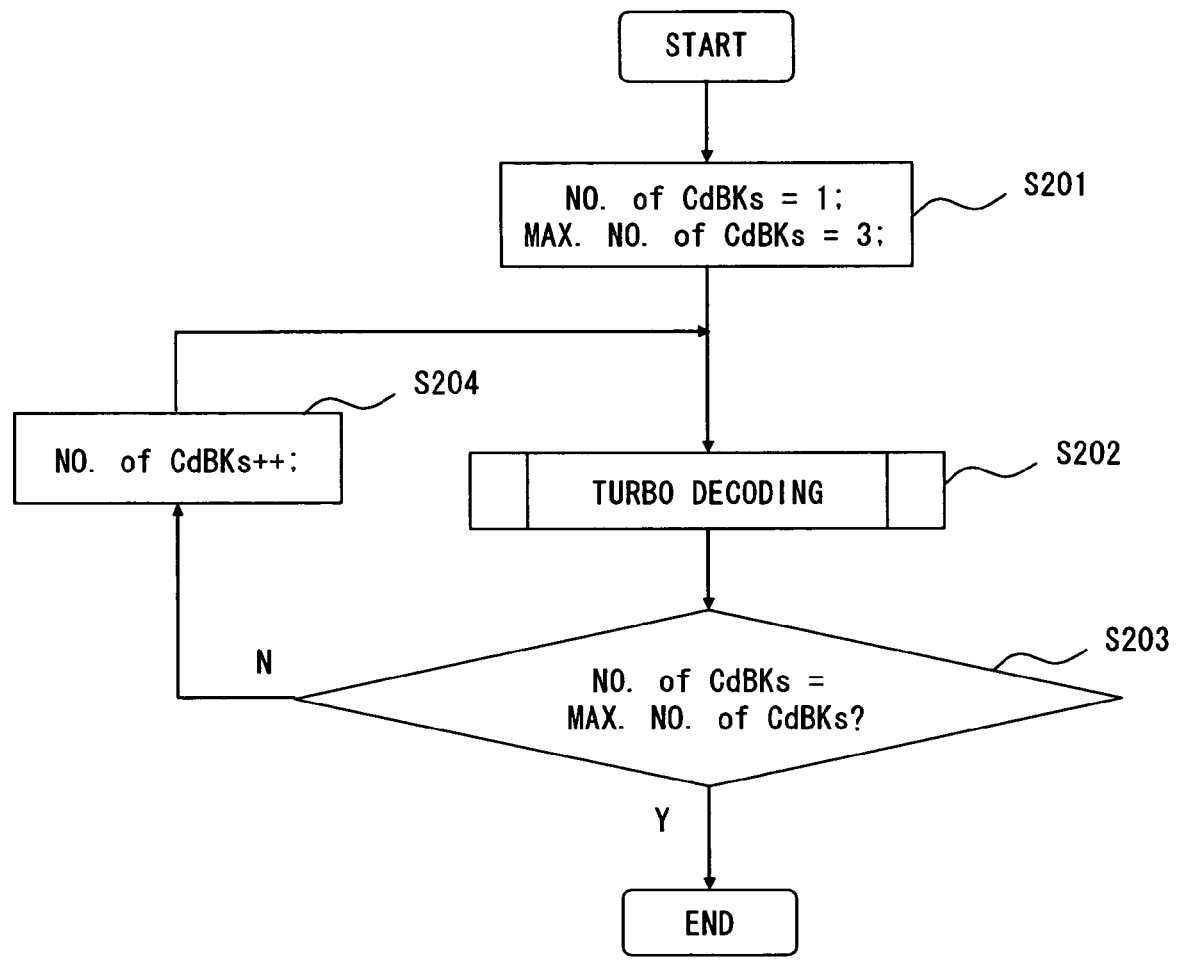
FIG. 19 is a flowchart showing a decoding method according to the related art D.
Figure 20A:
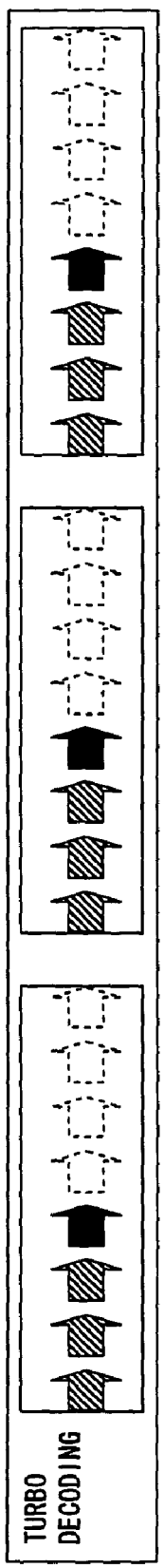
FIG. 20A is a view to describe a drawback of the related art D in a case where non-convergence is detected.
Figure 20B:
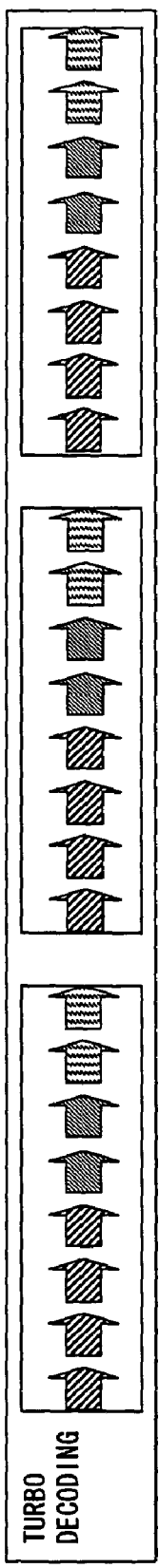
FIG. 20B is a view to describe a drawback of the related art D in a case where either convergence or non-convergence is not detected in any code blocks CdBK.
Figure 20B:
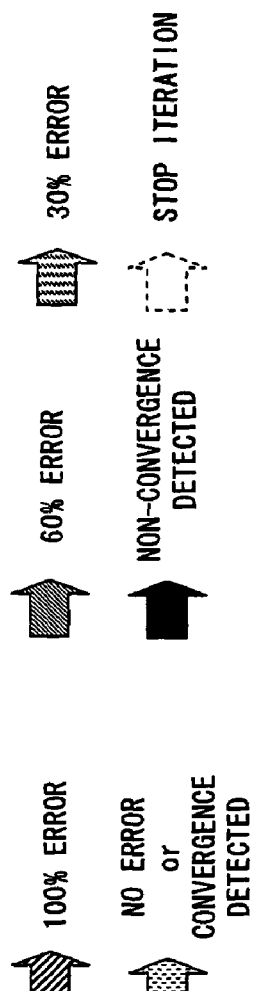

The decoding device 1 receives turbo codes as received data which are transmitted through a transmission line. The received data contains a first elemental code E and a second elemental code $E^{int}$ which may be generated by an encoding device as shown in FIG. 12. The elemental codes E and $E^{int}$ are composed of parity bits 1P, 2P and systematic bits U, $U^{int}$ as described above. Because the systematic bits $U^{int}$ of the second elemental code $E^{int}$ can be obtained by interlaving the systematic bits U of the first elemental code E, the actually transmitted data are the systematic bits U and the parity bits 1P of the first elemental code E and the parity bits 2P of the second elemental code $E^{int}$. The turbo codes are not limited to the parallel concatenated convolutional codes as described above and may be any codes which can be turbo-decoded by the decoding device 1, such as serial concatenated convolutional codes.

The first decoder 2 and the second decoder 3 are soft-output decoding sections which perform iterative decoding of the received data by soft-input soft-output decoding. SOVA and MAP are known as the soft-input soft-output decoding.

The MAP is described hereinafter by way of illustration. The first decoder 2 receives the received first elemental code E (first parity $Y_{1p}$, systematic bits $Y_s$) and external information $L_{e2}$. Based on these input values, the first decoder 2 performs decoding by the known soft-input soft-output decoding which generates soft-output using the value calculated by the forward processing and the backward processing in the trellis and outputs first external information $L_{e1}$. The interleaver 4 interleaves the first external information $L_{e1}$ to generate interleaved first external information $L^{int}_{e1}$. At the same time, the interleaver 5 interleaves the systematic bits $Y_s$ to generate interleaved systematic bits $Y^{int}_s$, which is then supplied to the second decoder 3.

The second decoder 3 receives the interleaved first external information $L^{int}_{e1}$, the received second parity $Y_{2p}$, and the interleaved systematic bits $Y^{int}_s$. The second decoder 3 performs decoding by the known soft-input soft-output decoding, and outputs second external information $L^{int}_{e2}$. The second external information $L^{int}_{e2}$ is then de-interleaved by the de-interleaver 6 and supplied to the first decoder 2. Subsequently, the process that the first decoder 2 performs decoding using the second external information $L_{e2}$ supplied from the de-interleaver 6 and the channel values (first parity $Y_{1p}$, systematic bits $Y_s$), and the second decoder 3 performs decoding using the interleaved first external information $L^{int}_{e1}$ and the channel value (second parity $Y_{2p}$) is repeated. One-time iterative decoding ends upon completion of the decoding process in the first decoder 2 and the second decoder 3.

The second decoder 3 outputs logarithmic likelihood ratio $L^{int}_2$ which is generated in the process of decoding to the de-interleaver 7. The de-interleaver 7 de-interleaves the logarithmic likelihood ratio $L^{int}_2$ into logarithmic likelihood ratio $L_2$, and then the hard decision section 8 determines a hard decision result û. Further, in the decoding device 1 of this embodiment, the hard decision result û is supplied to the stop/end determination section 9, which then determines whether or not to stop the iterative process of turbo decoding.

The stop/end determination section 9 compares the BER which is calculated by HDA and the information length rate with thresholds and determines whether error detection of turbo codes is converged or not to thereby optimize the iterative number of turbo decoding.

The decoding device 1 of this embodiment receives a transport block as received data. FIG. 2A is a schematic view to describe the transport block. According to the HSDPA, a transport block TrBK contains one or a plurality of code blocks CdBK depending on a category in accordance with a channel transfer rate as described above. In the following description, a transport block TrBK contains three code blocks CdBK as an example. As shown in FIG. 2A, an error correcting code CRC is added to the transport block TrBK.

In the decoding device 1, the transport block TrBK is divided into three code blocks CdBK before being decoded. Because a code length which can be processed in one-time decoding step is limited in the HSDPA standard, a transport block TrBK which can be divided into unit code blocks is created and transferred by the transmitting side. The code block CdBK is a decoding unit block. The decoding device 1 performs decoding sequentially on the code blocks CdBK. The hard decision section 8 outputs a hard decision result û after the second or subsequent iterative decoding process. Based on the hard decision result, the stop/end determination section 9 performs stop determination to determine whether convergence occurs or not as described later.

The stop/end determination section 9 of this embodiment performs the stop determination on each code block CdBK and, based on the determination result, further performs end determination to determine whether or not to continue the decoding process of the transport block TrBK each time the iterative decoding ends in each code block CdBK. In the end determination on the transport block TrBK, if non-convergence is detected in one code block CdBK as shown in FIG. 2B or if convergence is not detected during decoding on one code block CdBK up to a maximum iterative decoding number as shown in FIG. 2C, the decoding on the subsequent code blocks is stopped, so that the decoding process of the currently processed transport block TrBK as a whole is ended.

In this embodiment, the stop/end determination section 9 uses the above-described HDA for the stop determination on each code block CdBK and the end determination on the transport block TrBK. The stop determination process detects convergence/non-convergence and stops the iterative decoding. The end determination process ends the processing on the transport block TrBK except when the code block CdBK is converged and the iterative decoding is ended. For example, when performing turbo decoding on the code blocks CdBK in a serial manner sequentially from the first code block CdBK, if non-convergence is determined at the fourth iterative decoding step (FIG. 2B) or if a high error rate of CRC is expected upon completion of the turbo decoding at the maximum iterative number (FIG. 2C) in the 1st code block CdBK, the relevant packet data (transport block) is abandoned without performing the turbo decoding on the remaining code blocks CdBK.

Particularly, because a CRC is added only to the Last code block CdBK according to the HSDPA standard, the conventional method of detecting that the CRC is an error and thereby ending the process requires the decoding process to be always performed until completing the Last code block CdBK. On the other hand, this embodiment performs the end determination for the decoding process on the transport block TrBK based on whether the iterative decoding on the code block CdBK is converted or not. It is thereby possible to determine the end of the decoding process before completing the Last code block CdBK, which prevents the useless iterative decoding process to consequently reduce power consumption.

Although the transport block according to the HSDPA standard is described in this embodiment by way of illustration, the present invention is not limited thereto as long as it is capable of dividing one received data into a plurality of units which can be turbo-decoded for stop determination in a decoding stage. By performing the stop determination on a divided unit code, it is possible to end the iterative decoding before completing the entire decoding process and proceed to an error handling step such as request for retransmission of packets.

Further, although the HSDPA where a CRC is added to the end of a transport block TrBK is described in this embodiment by way of illustration, the present invention may be also applied to the case where an error detecting code is not added. Specifically, in this embodiment, error determination is performed using the CRC for final confirmation after the stop/end determination section 9 determines the convergence in all the code blocks CdBK. If no error detecting code is added, it is possible to conclude that no error exists as a whole if the determination result of the stop/end determination section 9 in each code block indicates convergence, which is no error.

Furthermore, although the HDA is used for the stop determination in this embodiment, other determination method, such as the one taught by Taffin, may be used instead. Other methods include the Approximated Cross Entropy Stopping Criterion that stops decoding when a probabilistic closeness of a SISO decoder output is significantly high, the Minimum Absolute LLR Stopping Criterion that sets a minimum absolute value of output LLR information of an arbitrary SISO decoder as a measurement value and utilizing the measurement value which is set by the previous iterative decoding process as a current critical value, the Sign Difference Ratio Stopping Criterion that compares all of input pre-information to a current frame and output additional information (sign) of one SISO decoder and stops the decoding process in accordance with the number of different codes, and so on.

Figure 3:
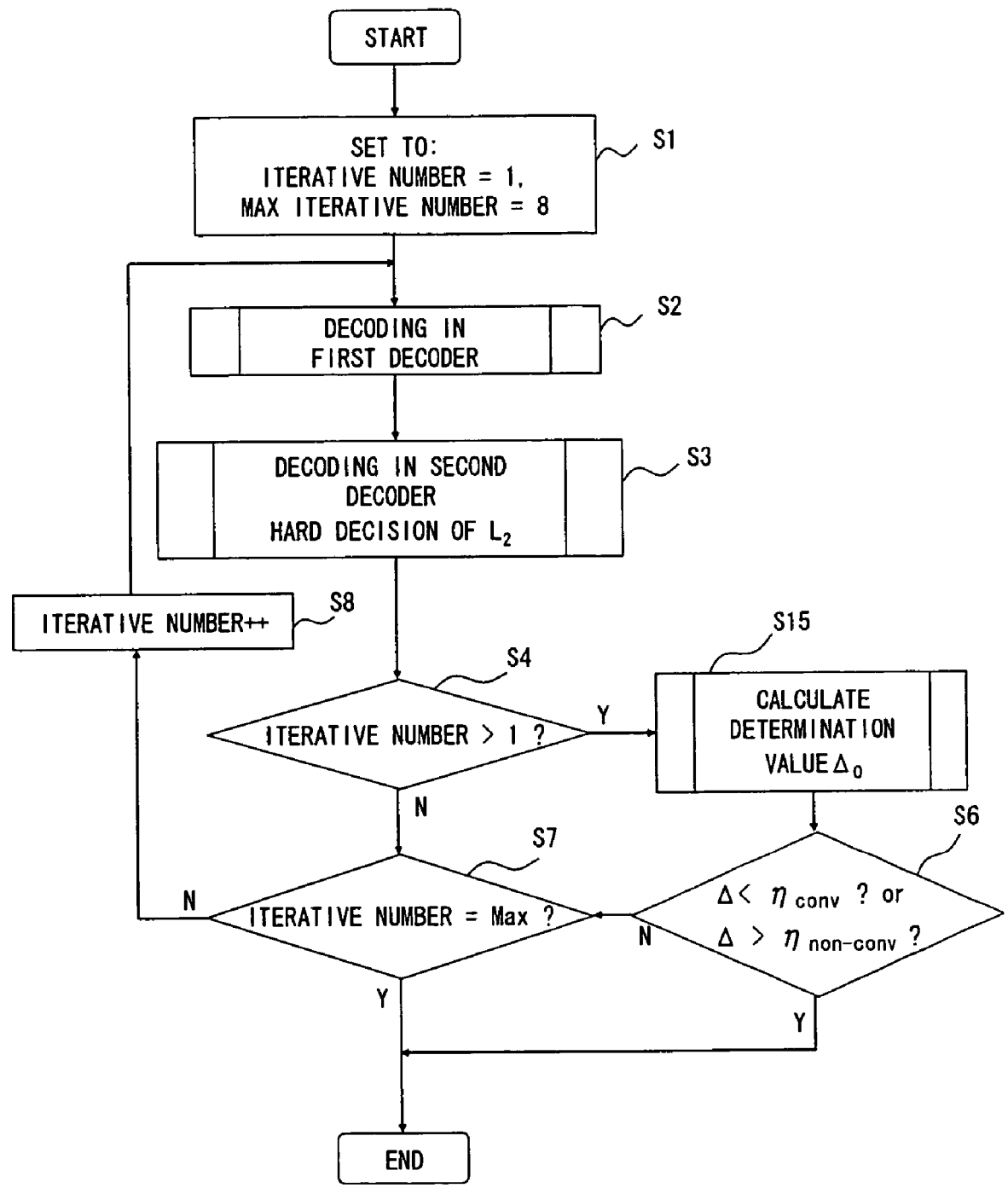
FIG. 3 is a flowchart showing a method of decoding a code block CdBK according to the first embodiment of the present invention.

A decoding method according to this embodiment is described hereinafter in detail. FIG. 3 is a flowchart showing a method of decoding a code block CdBK of the decoding device 1. In this example, a maximum value of the iterative decoding number is 8. The method of decoding a code block CdBK shown in FIG. 3 is the same as the conventional decoding method described earlier.

Specifically, as shown in FIG. 3, the number of times of iterative decoding to be performed in the first decoder 2 and the second decoder 3 (the iterative number) is set to 1, and an upper limit of the iterative number is set to 8 (Step S1). Then, the first decoder 2 performs decoding to generate first external information $L_{e1}$ (Step S2). The interleaver 4 interleaves the first external information $L_{e1}$ and supplies the result to the second decoder 3. At the same time, the interleaver 5 interleaves the systematic bits $Y_s$ and supplies the result to the second decoder 3. Although the first decoder 2 also generates a logarithmic likelihood ratio (LLR) $L_1$, it is not used herein. An initial value of an input $L_{e2}$ to the first decoder 2 is 0.

The second decoder 3 outputs the interleaved second external information $L^{int}_{e2}$ and the interleaved logarithmic likelihood ratio $L^{int}_{2}$. The interleaved second external information $L^{int}_{e2}$ is de-interleaved by the de-interleaver 6 into second external information $L_{e2}$ to be input to the first decoder 2. The interleaved logarithmic likelihood ratio $L^{int}_{2}$ is de-interleaved by the de-interleaver 7 into logarithmic likelihood ratio $L_2$ and then input to the hard decision section 8 where a hard decision result is generated.

After that, it is determined whether the iterative number exceeds 1 or not (Step S4) and, if the iterative number is equal to or more than 2, a determination value $\Delta_0$ is calculated as the following Expression 1 (Step S5).

$$\Delta_0 = \frac{1}{N} \sum_{k=0}^{N-1} |\hat{u}_k(L_2^i) - \hat{u}_k(L_2^{i-1})| \quad (1)$$

where k indicates a bit identifier in block, i indicates an iterative number, N indicates a block length, û( ) indicates a hard decision result, $L_2$ indicates a logarithmic likelihood ratio LLR of the second decoder, and $\Delta_0$ indicates a ratio of differences in hard decision results.

Thus, the determination value $\Delta_0$ represented by Expression 1 indicates an average of differences between the current logarithmic likelihood ratio $L_2$ and the previous logarithmic likelihood ratio $L_2$ for each bit. If the determination value $\Delta_0$ approximates 0, the current and previous decoding results are equal. If the determination value $\Delta_0$ approximates 1, the current and previous decoding results differ largely.

If the determination value $\Delta_0$ is larger than a convergence determining threshold $\eta_{conv}$ or smaller than a non-convergence determining threshold $\eta_{non-conv}$ (No in Step S6), the iterative decoding is performed until the iterative number reaches MAX=8. Thus, the process determines whether or not the iterative number reaches MAX=8 (Step S7) and, if it is less than 8, it increments the iterative number (Step S8) and repeats the process from Step S2.

For the determination of the determination value $\Delta_0$ in Step S6, when the iterative number is 2 or above, the determination value $\Delta_0$ is calculated by Expression 1 using a hard decision result û. Then, a stopping determination is performed based on the convergence determining threshold $\eta_{conv}$ and the non-convergence determining threshold $\eta_{non-conv}$. If the determination results in that either of convergence/non-convergence condition is satisfied, the iterative decoding on the code block CdBK is stopped.

Figure 4:
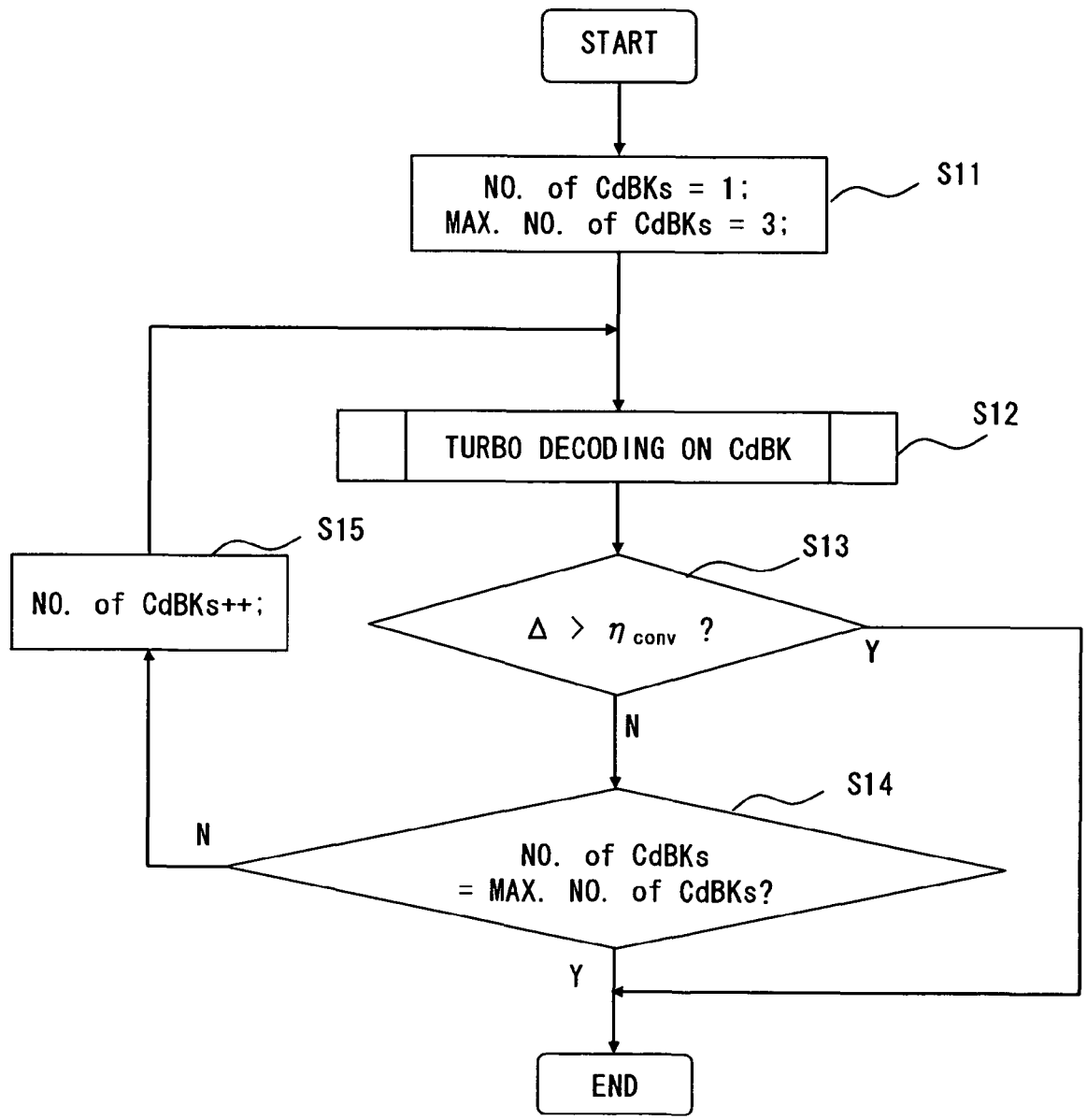
FIG. 4 is a flowchart showing a method of decoding received data according to the first embodiment of the present invention.

In this embodiment, the transport block TrBK as received data contains a plurality of code blocks as described earlier. FIG. 4 is a flowchart showing a method of decoding the transport block according to this embodiment. In this example, the number of code blocks CdBK contained in one transport block TrBK is three as described above. After completing the iterative decoding on each of the three code blocks CdBK, the end determination to determine whether the iterative decoding on the code block CdBK is converged or not is performed using the determination value $\Delta_0$ in order to determine whether or not to continue the decoding process on the transport block TrBK.

Specifically, the process first sets the transport block No=1 and the number of transport blocks=3 (Step S11), and then performs turbo decoding as shown in FIG. 3 described above (step S13). After completing the decoding on one code block CdBK, the process then determines whether the determination value $\Delta_0$ is larger than the convergence determining threshold $\eta_{conv}$ or not (step S13). In other words, it determines whether the code block CdBK which is decoded by Step S12 is eventually determined to be converged and the iterative decoding is stopped (including a maximum 8 times).

If the determination value $\Delta_0$ is determined to be larger than the convergence determining threshold $\eta_{conv}$ indicating no convergence, the processing on the transport block TrBK is ended. In this case, the decoding device 1 may make a request for retransmission of packets for the relevant transport block TrBK, for example.

On the other hand, if the code block CdBK is determined such that error correction (convergence) can be made and the iterative decoding is stopped, the code block number is incremented until it reaches a maximum value, i.e. =3 (Steps S14 and S15), and the process repeats from Step S12. Then, if the convergence is determined in all the code blocks up to the Last code block CdBK, i.e. the above end determination does not results in "end", the code block CdBK is reset to the transport block TrBK, and the CRC determination on the transport block is performed by the subsequent stage of the hard decision section 8 or a CRC determination section placed in the hard decision section 8. If the convergence is determined in all the code blocks, the probability that the CRC determination results in an error is normally very small. The values of the thresholds $\eta_{conv}$ and $\eta_{1non-conv}$ may be predetermined appropriately by simulation or the like in accordance with the communication environments such as the condition of a transmission line and a transmission rate, a required BER, the number of times of iterative decoding, the configuration of a decoder and so on.

Figure 5:
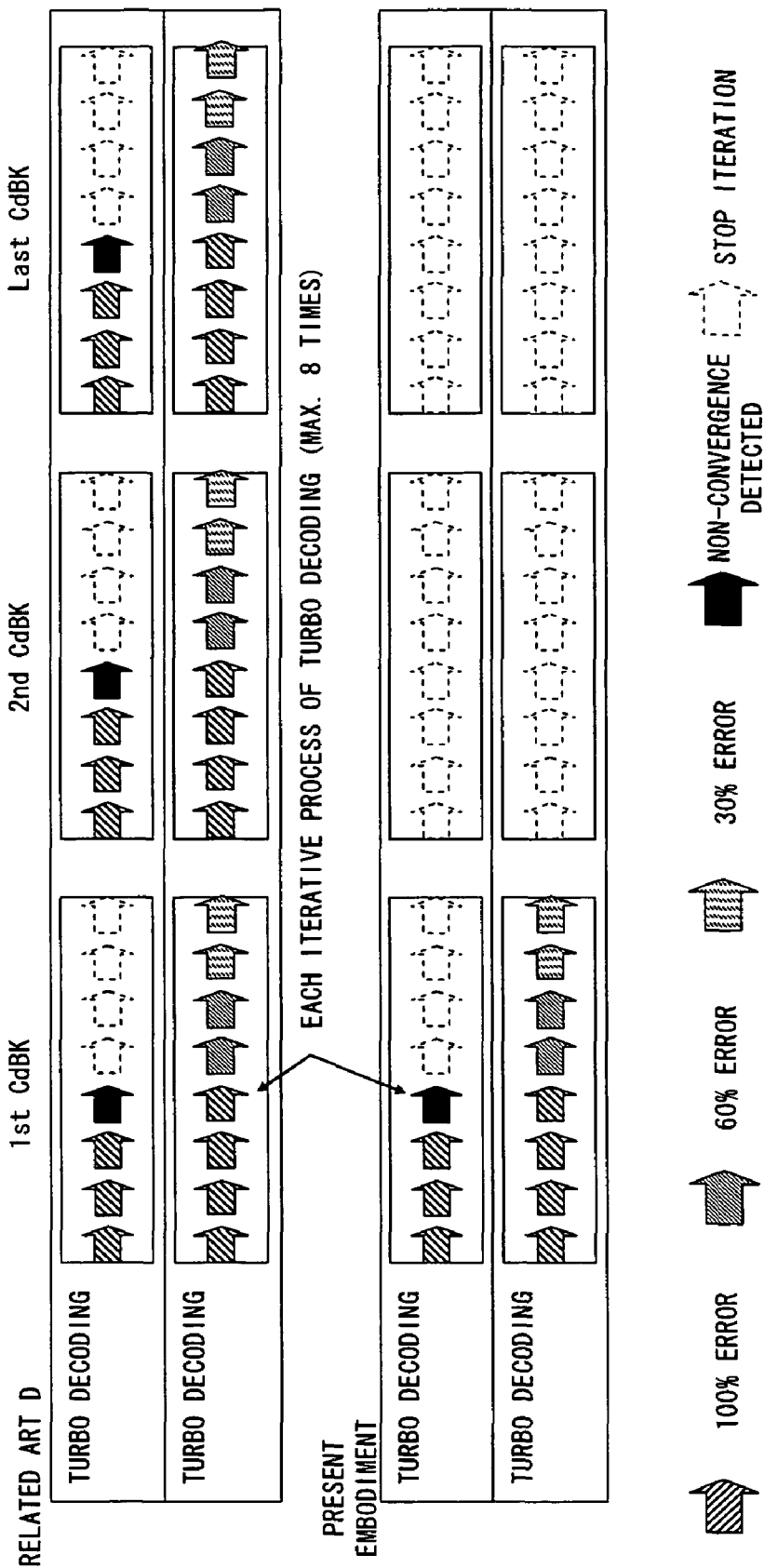
FIG. 5 is a view to describe advantages of the decoding device according to the first embodiment of the present invention.

Advantages of the present embodiment are described hereinafter. FIG. 5 is a view to describe the advantages of the decoding device according to this embodiment. The upper and lower illustrations in FIG. 5 schematically depict the iterative number of times of decoding when applying the decoding device according to the related art D and the present embodiment, respectively, to the HSDPA standards. FIG. 5 shows the cases where non-convergence is detected at the fourth iterative decoding step and where convergence/non-convergence cannot be detected during the iterative decoding process up to the maximum iterative number (=8 times) in the code blocks 1st CdBK to Last CdBK regarding each of the related art D and the present embodiment.

According to the method of the related art D, non-convergence is detected at the fourth iterative decoding step in the code block 1st CdBK and the process proceeds to the decoding of the next code block 2nd CdBK. After that, non-convergence is again detected at the fourth iterative decoding step and the process proceeds to the decoding of the final code block Last CdBK. Then, non-convergence is again detected at the fourth iterative decoding step, and, eventually, an error is checked using the CRC which is added to the final code block Last CdBK. Although the use of the detection of non-convergence allows the iterative decoding of each code block to be stopped upon reaching 4 times, this technique still requires total 12 times of decoding processes until detecting an error by CRC and abandoning the transport block.

Further, in the case where convergence or non-convergence cannot be detected, the maximum iterative decoding number (=8) of times of decoding processes should be performed in each code block CdBK. Accordingly, despite that the CRC checking is likely to result in an error, total 24 times of decoding processes are required.

On the other hand, according to the present embodiment, the end determination for the transport block TrBK using the determination value $\Delta_0$ is performed each time the turbo decoding ends in each code block CdBK as shown in Step S13. This embodiment carries out the determination with the determination value $\Delta_0$ after completing the turbo decoding in the first code block 1st CdBK. This determination enables detection that an error in the relevant transport block TrBK is not likely to be correctable, or that the probability of CRC error is high, so that the subsequent process can be stopped.

In the example shown in FIG. 5, if non-convergence is detected at the fourth iterative decoding step in the first code block 1st CdBK, it is possible to reduce the decoding process by 8 times compared with the related art D. Even if convergence cannot be detected at the first code block 1st CdBK and the iterative decoding is performed up to 8 times, it is possible to reduce the decoding process by 16 times compared with the related art D.

As described in the foregoing, the present embodiment divides the received data into a plurality of units (code blocks) which can be turbo-decoded before processing, and performs the stop determination on the iterative decoding of each code block using the determination value $\Delta_0$ which indicates the ratio of differences in hard decision results. It further performs the end determination using the determination value $\Delta_0$ after the turbo decoding of the code block, thereby determining whether or not to end the decoding process of the transport block containing the relevant code block. The received data where an error correction is not likely to be correctable can be thereby abandoned at an earlier point, which enables reduction in processing time and power consumption and prompt shifting to the next procedure such as retransmission request.

Second Embodiment

Figure 6:
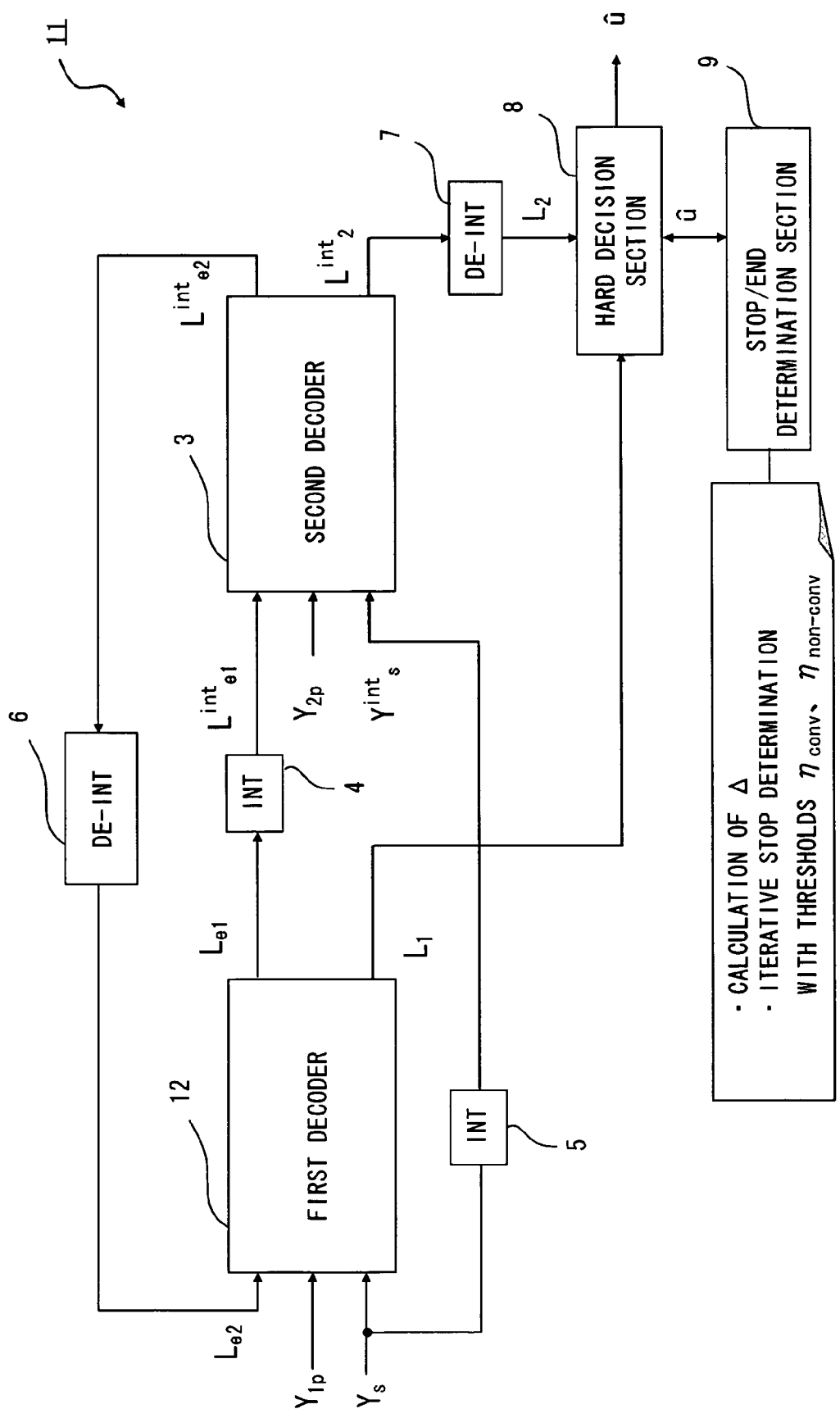
FIG. 6 is a view showing a decoding device according to a second embodiment of the present invention.

A second embodiment of the present invention is described hereinafter. This embodiment further increases the efficiency of the stop determination process in a code block which is performed as described in the first embodiment to thereby further reduce the number of times of iterative decoding. FIG. 6 is a view showing a decoding device according to this embodiment. In the second embodiment shown in FIG. 6 and an alternative embodiment of the second embodiment shown in FIG. 8 described later, the same elements as in the first embodiment shown in FIG. 1 are denoted by the same reference numerals and not described in detail herein.

As shown in FIG. 6, the second embodiment is different from the first embodiment in that the output of a first decoder 12 is supplied to the hard decision section 8. Specifically, in this embodiment, the first decoder 12 supplies the logarithmic likelihood ratio $L_1$ which is generated in the process of decoding to the hard decision section 8. The second decoder 3 supplies the interleaved logarithmic likelihood ratio $L^{int}_2$ which is also generated in the process of decoding to the de-interleaver 7. The de-interleaver 7 de-interleaves the logarithmic likelihood ratio $L^{int}_2$ into the logarithmic likelihood ratio $L_2$ and supplies it to the hard decision section 8. The hard decision section 8 calculates a hard decision result (hereinafter referred to as $\hat{u}(L_1)$) using the logarithmic likelihood ratio $L_1$ supplied from the first decoder 12 and a hard decision result (hereinafter referred to as $\hat{u}(L_2)$) using the logarithmic likelihood ratio $L_2$ which is de-interleaved from the logarithmic likelihood ratio $L^{int}_2$ supplied from the second decoder 3. The hard decision results $\hat{u}(L_1)$ and $\hat{u}(L_2)$ are supplied to the stop/end determination section 9, which then performs the stop determination for determining whether or not to stop the iterative decoding on the code block CdBK and the end determination for determining whether or not to end the decoding process of the transport block TrBK.

The stop/end determination section 9 of this embodiment compares the BER which is calculated by HDA and the information length rate with thresholds and determines whether error detection of turbo codes is converged or not to thereby optimize the iterative number of turbo decoding. The timing of this processing is different from that in the first embodiment.

Specifically, the stop/end determination section 9 of this embodiment determines a determination value to be used for the stop determination and compares the value with the convergence determining threshold $\eta_{conv}$ and the non-convergence determining threshold $\eta_{non\text{-}conv}$ to thereby determine whether to stop the iterative decoding just like the first embodiment. However, this embodiment is different from the first embodiment in that the timing to calculate the determination value is upon completion of the decoding performed in each decoder. Because the present embodiment detects convergence/non-convergence of the iterative decoding using the logarithmic likelihood ratios $L_1$ and $L_2$, it uses two determination values $\Delta_{0.5}$ and $\Delta_1$ as represented by Expressions 2 and 3 below:

$$\Delta_{0.5} = \sum_{k=0}^{N-1} |\hat{u}_k(L_1^i) - \hat{u}_k(L_2^{i-1})| \qquad (2)$$

$$\Delta_1 = \sum_{k=0}^{N-1} |\hat{u}_k(L_1^i) - \hat{u}_k(L_2^i)| \qquad (3)$$

where k indicates a bit identifier in block, i indicates an iterative number, N indicates a block length, $\hat{u}()$ indicates a hard decision result, $L_1$ indicates a logarithmic likelihood ratio LLR of the first decoder, $L_2$ indicates a logarithmic likelihood ratio LLR of the second decoder, and $\Delta_{0.5}$, $\Delta_1$ indicate the ratios of differences in hard decision results.

The determination value $\Delta_{0.5}$ in Expression 2 indicates an average of differences between the current logarithmic likelihood ratio $L_1$ obtained by the first decoder 12 and the previous logarithmic likelihood ratio $L_2$ obtained by the second decoder 3 for each bit. The determination value $\Delta_1$ in Expression 3 indicates an average of differences between the current logarithmic likelihood ratio $L_1$ obtained by the first decoder 12 and the current logarithmic likelihood ratio $L_2$ obtained by the second decoder 3 for each bit. If the determination values $\Delta_{0.5}$ and $\Delta_1$ approximate 0, the decoding result of the first decoder 12 and the decoding result of the second decoder 3 are equal. If the determination values $\Delta_{0.5}$ and $\Delta_1$ approximate 1, the decoding results of the decoders 12 and 3 differ largely, indicating that the decoding is not yet converged. This is the same as in the first embodiment.

The first iterative decoding step ends after the decoding process is performed in the first decoder 12 and the second decoder 3. As shown in Expression 2, the timing to calculate the determination value $\Delta_{0.5}$ is not upon completion of normal iterative decoding but upon completion of decoding in the first decoder 12. Thus, the determination value $\Delta_{0.5}$ is calculated in the middle of the iterative decoding process in this embodiment. As shown in Expression 3, the determination value $\Delta_1$ is calculated upon completion of decoding in the second decoder 3. In this way, the present embodiment does not calculate the determination value for stop determination for each iterative decoding but calculate the determination values $\Delta_{0.5}$ and $\Delta_1$ at each timing when the decoding process in the decoders 12 and 3 ends. Accordingly, in this embodiment which uses two decoders, it is possible to perform the stop determination at a double rate. Accordingly, if there are two or more stages of decoders, the stop determination can be performed at more precise timings.

The decoding method according to the second embodiment is described hereinafter. The method of decoding the received data according to the second embodiment is different from the method of decoding the received data according to the first embodiment in the decoding of each code block CdBK, which corresponds to Step 12 in FIG. 4. Specifically, the timing of stop determination in iterative decoding in each code block is different. The other points are the same as the first embodiment.

Figure 7:
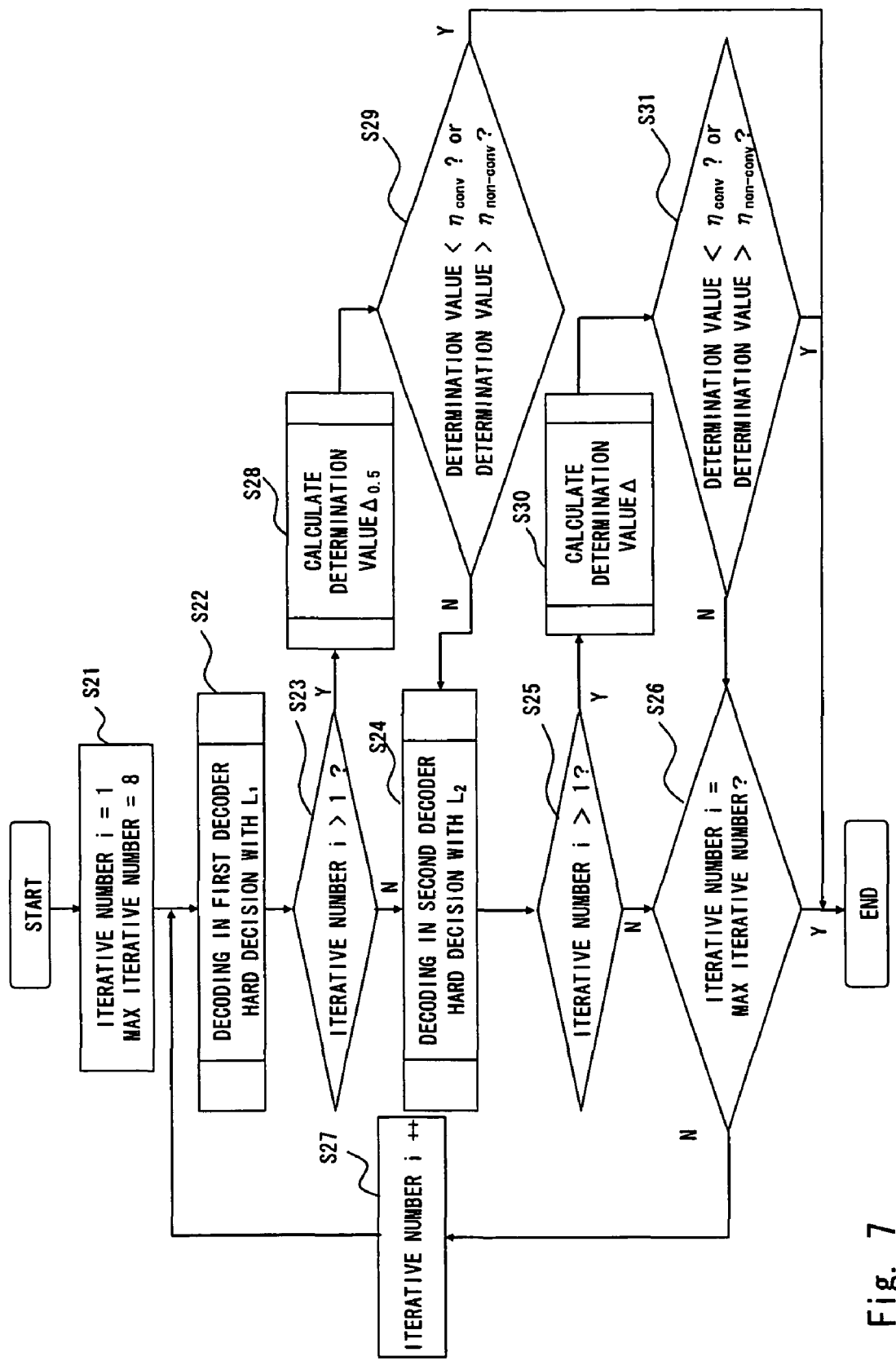
FIG. 7 is a flowchart showing a decoding method according to the second embodiment of the present invention.

FIG. 7 is a flowchart showing the method of decoding each code block according to the second embodiment. In this example, a maximum number of times of iterative decoding in the decoders 12 and 3 is 8. As shown in FIG. 7, the process first sets the iterative number i=1 and the Max iterative number=8 (step S21) and performs the decoding process in the first decoder 12. The first decoder 12 executes the same decoding process as in the first decoder 2 shown in FIG. 1. Specifically, the decoding process in the first decoder 12 calculates the first external information $L_{e1}$ and the logarithmic likelihood ratio $L_1$ from the second external information $L_{e2}$, and the channel values $Y_{1p}$ and Y. The first external information $L_{e1}$ is supplied to the interleaver 4, interleaved thereby, and input to the second decoder 3. At the same time, the systematic bits $Y_s$ is interleaved by the interleaver 5 and input to the second decoder 3. An initial value of the second external information $L_{e2}$ to be input to the first decoder 12 is 0. In this embodiment, the logarithmic likelihood ratio $L_1$ is supplied to the hard decision section 8.

The hard decision section 8 calculates a hard decision result û ($L_1$) using the logarithmic likelihood ratio $L_1$ (Step S22). If the current iterative number i is less than 1 (N in Step S23), the second decoder 3 executes the same decoding process as in the second decoder 3 in the first embodiment (Step S24). Specifically, the second decoder 3 receives the interleaved first external information $L^{int}_{e1}$, the channel value $Y_{2p}$, and the interleaved channel value $Y^{int}_s$, outputs the interleaved second external information $L^{int}_{e2}$ and the interleaved logarithmic likelihood ratio $L^{int}_2$. The interleaved second external information $L^{int}_{e2}$ is then de-interleaved by the de-interleaver 6 into the second external information $L_{e2}$ to be input to the first decoder 12. The interleaved logarithmic likelihood ratio $L^{int}_2$ is de-interleaved by the de-interleaver 7 into the logarithmic likelihood ratio $L_2$ and supplied to the hard decision section 8. The hard decision section 8 uses the logarithmic likelihood ratio $L_2$ to calculate a hard decision result û ($L_2$). The hard decision result û ($L_2$) is stored in a memory which is placed in the hard decision section 8 or the stop/end determination section 9, or a separate memory (not shown).

Then, if the current iterative number i is less than 1 (N in Step S25), it is determined whether the iterative number is a maximum number=8 or not (Step S26). If no, the iterative number i is incremented (Step S27) and the process repeats from Step S22.

If the current iterative number reaches 2, the decoding process is performed similarly in Step S22 to calculate a hard decision result û ($L^2_1$). The hard decision result û ($L^2_1$) is stored in the memory in the hard decision section 8.

Then, the iterative number is determined to be larger than 1 (Y in Step S23), and the stop/end determination section 9 calculates the determination value $\Delta_{0.5}$. In this step, the determination value $\Delta_{0.5}$ is calculated from Expression 2 based on the hard decision result û ($L^2_1$) which is calculated in Step S22 and stored and a hard decision result û ($L^1_2$) which is calculated in Step S25 in the previous iterative decoding process and stored in a memory. Then, it is determined whether the determination value $\Delta_{0.5}$ is smaller than the convergence determining threshold $\eta_{conv}$ (i.e. convergence) or larger than the non-convergence determining threshold $\eta_{non-conv}$ (i.e. non-convergence) and, if value satisfies either convergence or non-convergence conditions, the process ends.

If, on the other hand, the value does not satisfy neither convergence nor non-convergence conditions (N in Step S29), the decoding is performed similarly in Step S24 to calculate a hard decision result û ($L^2_2$) and store it in a memory. After Step S25, the process calculates the determination value $\Delta_1$ (Step S30). In this step, the determination value $\Delta_1$ is calculated from Expression 3 based on the hard decision result û ($L^2_1$) in the current iterative decoding which is calculated in Step S22 and stored and the hard decision result û $L^2_2$) also in the current iterative decoding which is calculated in Step S24 and stored. The process then determines whether the determination value $\Delta_1$ is smaller than the convergence determining threshold $\eta_{conv}$ (i.e. convergence) or larger than the non-convergence determining threshold $\eta_{non-conv}$ (i.e. non-convergence) (Step S31) and, if value satisfies either convergence or non-convergence conditions, the process ends. In this way, the process repeats the procedure from Step S22 until the determination value $\Delta_0$ or $\Delta_1$ satisfies the convergence or non-convergence conditions or the iterative maximum number (=8) is reached.

As described in the foregoing, the present embodiment performs the stop determination once per substantially 0.5 times of the iterative decoding in each code block CdBK. Specifically, upon completion of the decoding by the first decoder 12, the determination on convergence/non-convergence is performed using the determination value $\Delta_{0.5}$. Further, upon completion of the decoding by the second decoder 3, which is upon completion of normal one-time iterative decoding step, the determination on convergence/non-convergence is performed using the determination value $\Delta_1$. This enables performing double number of times of stop determination. It is thereby possible to reduce the iterative process by 0.5/2 times on average, theoretically. The increase in the efficiency of turbo decoding in the code blocks enhances the efficiency of the decoding process in the transport block.

Alternative Version of Second Embodiment

An alternative version of the second embodiment of the present invention is described hereinafter. In this embodiment, the first decoder 12 and the second decoder 3 in the second embodiment are integrated into one decoder.

Figure 8:
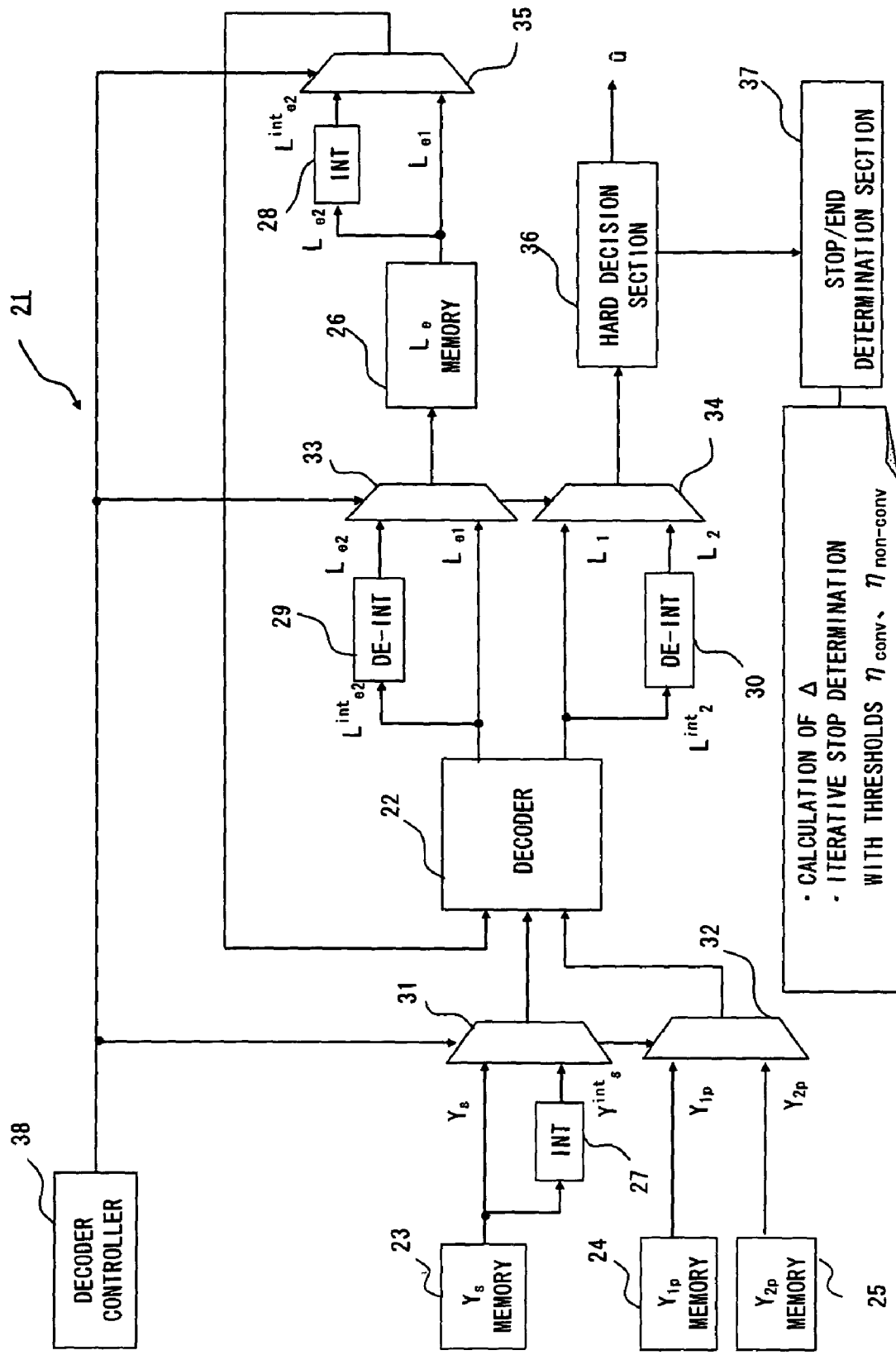
FIG. 8 is a block diagram showing a decoding device according to an alternative embodiment of the second embodiment of the present invention.

FIG. 8 is a block diagram showing a decoding device according to this alternative embodiment. The decoding device 21 includes a decoder 22 and memories 23 to 26 which store channel values $Y_s$ $Y_{1p}$, $Y_{2p}$, and external information $L_e$, respectively. The decoding device 21 also includes interleavers 27 and 28, de-interleavers 29 and 30, selectors 31 to 35, a hard decision section 36, a stop/end determination section 37, and a decoder controller 38.

The decoder 22 carries out the functions of the first decoder 12 and the second decoder 3 shown in FIG. 6. Accordingly, the selector 31 switches the selection between the output from the $Y_s$ memory 23 and the output from the $Y_s$ memory 23 which is interleaved by the interleaver 27 so that the selected one is input to the decoder 22. Further, the selector 32 switches the selection between the output from the $Y_{1p}$ memory 24 and the output from the $Y_{2p}$ memory 25 so that the selected one is input to the decoder 22.

The decoder 22 outputs the first external information $L_{e1}$ or the interleaved second external information $L^{int}_{e2}$. The first external information $L_{e1}$ is input to the selector 33 as it is, while the interleaved second external information $L^{int}_{e2}$ is input to the selector 33 after de-interleaved by the de-interleaver 29. The selector 33 selects either one and stores the selected value in the $L_e$ memory 26. The decoder 22 also outputs the logarithmic likelihood ratios $L_1$ and $L^{int}_2$. The logarithmic likelihood ratio $L_1$ is input to the selector 34 as it is, while the interleaved logarithmic likelihood ratio $L^{int}_2$ is input to the selector 34 after de-interleaved by the de-interleaver 30. The selector 34 selects either one and supplies the selected value to the hard decision section 36. The top/end determination section 37 calculates the determination values $\Delta_{0.5}$ and $\Delta_1$ as described above based on the hard decision result in the hard decision section 36.

The $L_e$ memory 26 outputs $L_{e1}$ and $L_{e2}$. The output $L_{e2}$ is interleaved by the interleaver 28 and input to the selector 35. The selector 35 selects either the first external information $L_{e1}$ or the interleaved first second external information $L^{int}_{e2}$ and supplies the selected one to the decoder 22.

The decoding method of the decoding device 21 is substantially the same as the method in the second embodiment shown in FIG. 7. The selectors 31 to 35 switch appropriately according to the control of the decoder controller 38, so that the decoder 22 operates as the first decoder 12 or as the second decoder 3.

Firstly, the decoder 22 functions as the first decoder 12. Under the control of the decoder controller 38, the channel values (systematic bits $Y_s$, parity bits $Y_{1p}$) from the $Y_s$ memory 23 and the $Y_{1p}$ memory 24, respectively, are supplied to the decoder 22 through the selectors 31 and 32. Further, the second external information $L_{e2}$ is supplied to the decoder 22 through the $L_e$ memory 26 and the selector 35. At the first iterative decoding, the external information $L_{e2}$ is set to 0. Based on these values, the decoder 12 outputs the external information $L_{e1}$ and the logarithmic likelihood ratio $L_1$.

The first external information $L_{e1}$ is supplied to the $L_e$ memory 26 through the selector 33, interleaved by the interleaver 28, and then supplied to the decoder 22 through the selector 35. At the same time, $Y_s$ from the $Y_s$ memory 23 is interleaved into $y^{int}_s$ by the interleaver 27 and supplied to the decoder 22 through the selector 31. Further, $Y_{2p}$ from the $Y_{2p}$ memory 25 is supplied to the decoder 22 through the selector 32. Receiving these values, the decoder 22 now functions as the second decoder 3 and outputs the second external information $L^{int}_{e2}$ and the logarithmic likelihood ratio $L^{int}_2$. The second external information $L^{int}_{e2}$ is de-interleaved by the de-interleaver 29, stored in the $L_e$ memory 26 through the selector 33, and then supplied to the decoder 22 through the selector 35 at an appropriate timing. In this way, the decoder 22 sequentially performs the decoding process as the first decoder and the decoding process as the second decoder in an alternative manner.

On the other hand, the logarithmic likelihood ratio $L_1$ which is calculated in the decoding process performed as the first decoder is supplied to the hard decision section 36 through the selector 34. The hard decision section 36 calculates a hard decision result using the logarithmic likelihood ratio $L_1$. Then, the decoder 22 performs the decoding process as the second decoder and calculates the logarithmic likelihood ratio $L^{int}_2$. The logarithmic likelihood ratio $L^{int}_2$ is de-interleaved by the de-interleaver 30 and supplied to the hard decision section 36 through the selector 34. The hard decision section 36 calculates a hard decision result using the logarithmic likelihood ratio $L_2$.

The hard decision result calculated from the logarithmic likelihood ratio $L_1$ and the hard decision result calculated from the logarithmic likelihood ratio $L_2$ are sequentially supplied to the stop/end determination section 37 at intervals of the iterative number of 0.5. The stop/end determination section 37 uses these values to calculate the determination values $\Delta_{0.5}$ and $\Delta_1$ from Expressions 2 and 3 at the timings of the iterative number of 0.5 and 1, respectively and compares these values with the convergence determining threshold $\eta_{conv}$ and the non-convergence determining threshold $\eta_{non-conv}$ for the stop determination. This process is the same as in the second embodiment.

As described in the foregoing, the present alternative embodiment, just like the second embodiment, performs the stop determination not in each iterative decoding but in each decoding process in a decoder on each code block. This enables more precise timings for stop determination and earlier detection of convergence/non-convergence by a maximum 0.5 times of the iterative decoding number, theoretically. Further, this alternative embodiment integrates the first and second decoders into one decoder 22, which reduces a circuit size.

Figure 9:
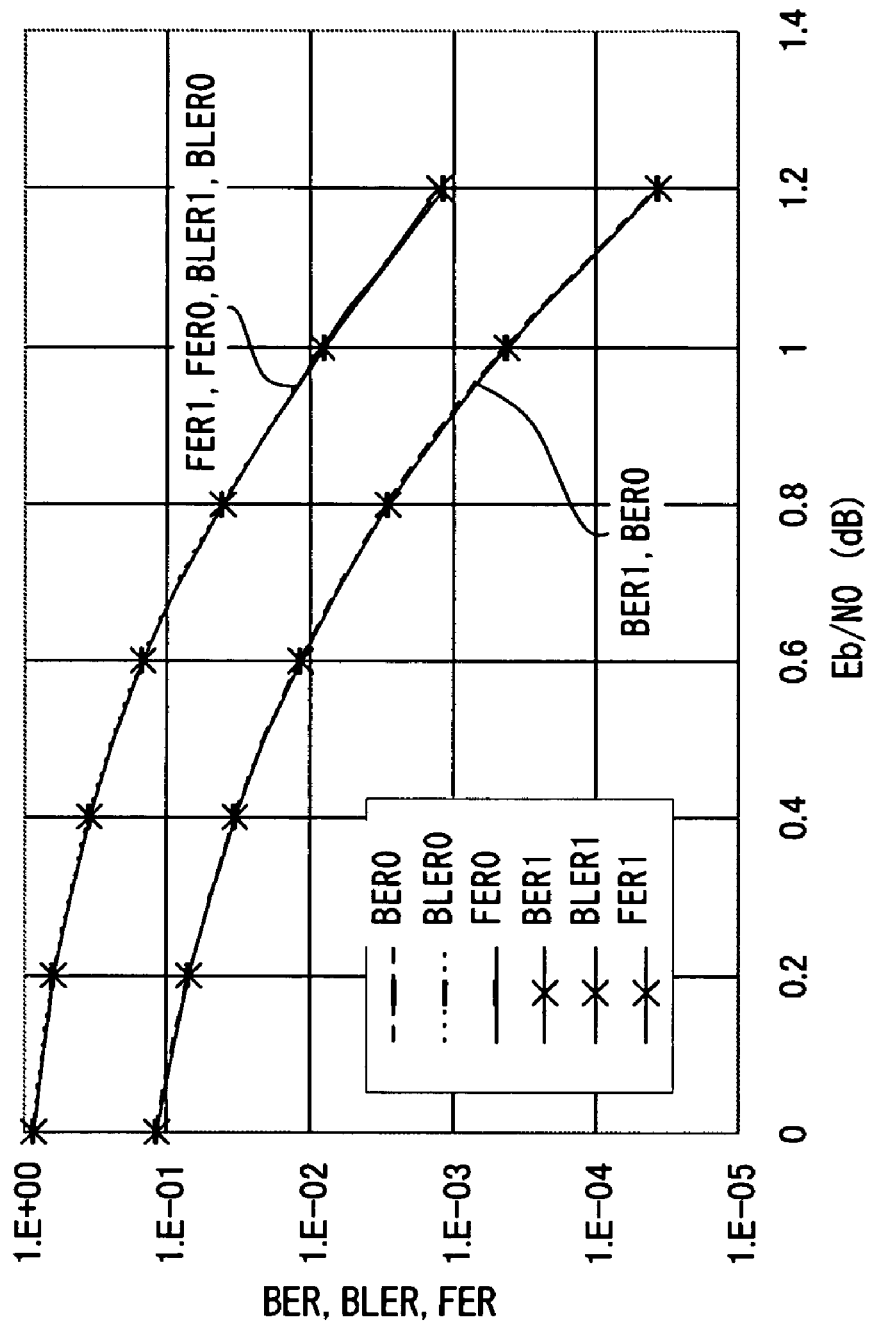
FIG. 9 is a view to describe advantages of the second embodiment of the present invention, which is a graph indicating a bit error rate (BER), a block error rate (BLER), and a frame error rate (FER) with respect to a signal-to-noise power density ratio ($E_b/N_0$)
Figure 10:
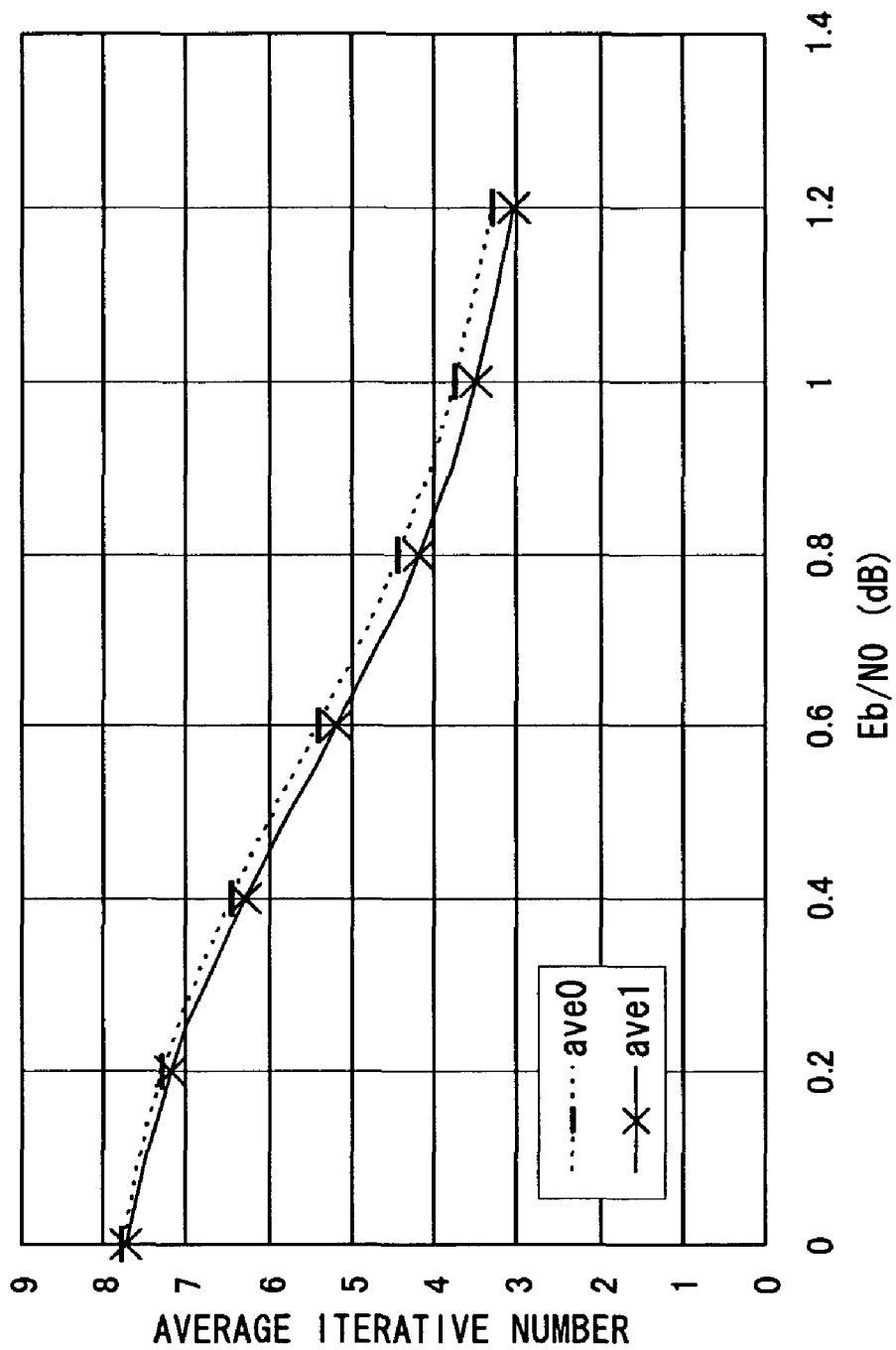
FIG. 10 is a view to describe advantages of the second embodiment of the present invention, which is a graph indicating an average iterative number with respect to a signal-to-noise power density ratio ($E_b/N_0$)

Advantages of the second embodiment are described hereinafter based on the simulation results of an example where the second embodiment is applied and a comparative example where a conventional stop method is applied. FIG. 9 is a graph indicating a bit error rate (BER), a block error rate (BLER) and a frame error rate (FER) with respect to a signal-to-noise power density ratio ($E_b/N_0$). FIG. 10 is a graph indicating an average iterative number with respect also to a signal-to-noise power density ratio ($E_b/N_0$).

In FIG. 9, the BER in the vertical axis indicates the number of error bits with respect to a total number of bits (error bit number/total bit number). The BLER indicates an error rate in a transport block. In this example, one frame contains one block, and one block contains 656 bits. The FER indicates the number of error frames with respect to a total number of frames (error frame number/total frame number). Because one frame corresponds to one transport block in this example, the FER is synonymous with the BLER. If one frame contains a plurality of transport blocks, the FER is different value from the BLER. The signal-to-noise power density ratio ($E_b/N_0$) in the horizontal axis indicates a power per bit (Eb) with respect to a power of noise ($N_0$). As the amount of noises is larger, the value of the signal-to-noise power density ratio is smaller.

In FIGS. 9 and 10, BER1, BLER1, FER1, and ava1 correspond to the present embodiment, and BER0, BLER0, FER0, and ava0 correspond to the related art. As shown in FIG. 9, FER1, FER0, BLER1 and BLER0 substantially overlap, and BER1 and BER0 also substantially overlap. Thus, there is no difference in error correction capacity between the case of performing the stop determination once per substantially 0.5 times of iterative decoding by applying the decoding method of this embodiment so as to detect convergence or not to thereby optimize the iterative decoding number and the case of performing the stop determination once per iterative decoding as normal so as to detect convergence/non-convergence to thereby optimize the iterative decoding number.

On the other hand, the average iterative number is smaller in this example (ava1) than in the related art (ava0) as shown in FIG. 10. In this simulation, under the condition of BLER=0.01 ($E_b/N_0$=1.0 dB), the iterative number can be reduced by about 0.25 times. Further, under the condition of $E_b/N_0$=1.2 dB, the iterative number can be reduced by about 0.26 times. Consequently, the application of the decoding method of this embodiment enables reduction in the number of times of iterative decoding in each code block while maintaining high error correction capacity.

Third Embodiment

Figure 11:
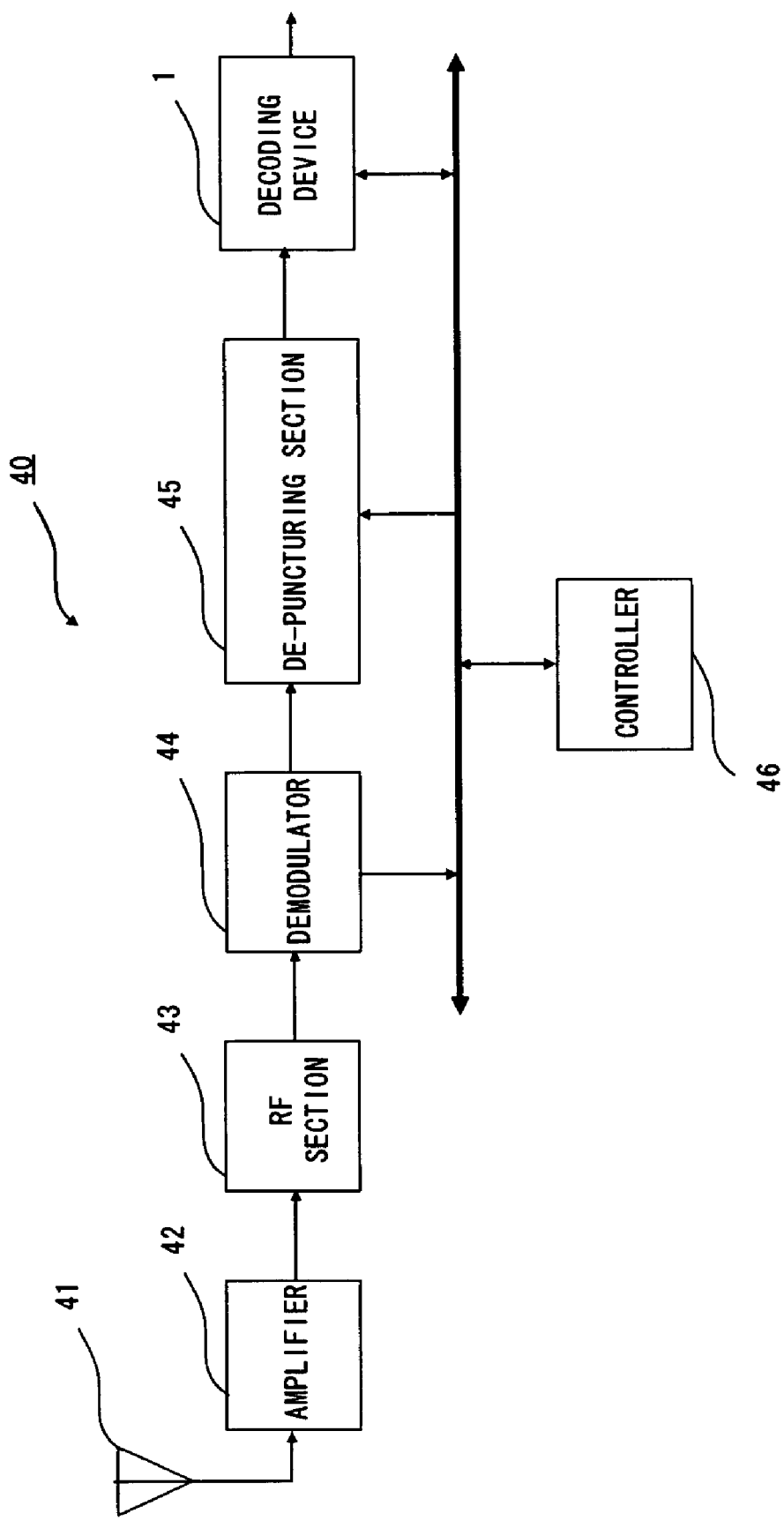
FIG. 11 is a view showing a receiving apparatus according to a third embodiment of the present invention.

A third embodiment of the present invention is described hereinafter. A receiving apparatus according to this embodiment includes the decoding device according to the first or the second embodiment. FIG. 11 is a view showing the receiving apparatus which includes the above-described decoding device 1, 11 or 21. In addition to the decoding device 1, the receiving apparatus 40 further includes an antenna 41, an amplifier 42, an RF section 43, a demodulator 44, a de-puncturing section 45, a controller 46 for controlling these elements and so on as shown in FIG. 11.

In the receiving apparatus 40, the received data received by the antenna 41 is supplied to the amplifier 42. The amplifier 42 amplifies the received data and supplies the amplified data to the RF section 43. The RF section 43 performs high frequency processing such as high frequency conversion and supplies the processed received data to the demodulator 44 for demodulation. The demodulated received data is then supplied to the de-puncturing section 45. The de-puncturing section 45 performs the de-interleaving which is reverse to the interleaving performed in the transmitting side to thereby restore the original data sequence and further performs the de-puncturing which inserts 0-bit to the position of data which is eliminated upon transmission to thereby restore the original data length. The data having the original data length as a result of the de-puncturing is supplied to the decoding device 1 for turbo decoding to thereby obtain a hard decision decoding result. The controller 46 controls the timing to supply data to the decoding device 1 based on the stop determination results in the decoding device 1, for example.

In the receiving apparatus 40 according to this embodiment, with the decoding device 1 described above, upon detection that error correction is not likely to be converged in one code block among a plurality of code blocks contained in a transport block, the decoding process in the transport block which contains the relevant code block is stopped. This enables provision of the receiving apparatus which is capable of decoding of a transport block at high rate to reduce power consumption. Further, if the receiving apparatus includes the decoding devices 11 or 21 described above, it is possible to make convergence determination in each code block at smaller iterative decoding number, which further increases the efficiency of decoding process.

The present invention is not limited to the above-described embodiments but may be altered in various ways without departing from the scope of the invention. For example, although the second embodiment uses Expressions 2 and 3 to calculate a determination value, it is not limited thereto. For example, Expression 3 may be any value which can be calculated at the timing upon completion of the first iterative decoding step, and it is possible to use Expression 1 below as described above in the first embodiment.

$$\Delta_0 = \frac{1}{N}\sum_{k=0}^{N-1} |\hat{u}_k(L_2^i) - \hat{u}_k(L_2^{i-1})| \quad (1)$$

Further, the determination value $\Delta_{0.5}$ which is represented by Expression 2 may be any value which can be calculated at the timing upon completion of the decoding process in the first decoder, and it is possible to use the external information $L_{e1}$ and $L_{e2}$ rather than the logarithmic likelihood ratios $L_1$ and $L_2$. Furthermore, although Expression 1 uses the result of the second decoder, if the decoding begins with the second decoder and the iterative decoding ends with the first decoder, it is possible to use the output $L_1$ from the first decoder to calculate a determination value. Although the left part of Expressions 1 to 3 is multiplied with 1/N, it is possible to multiply the threshold $\eta$ with N. It is also possible to compare the minimum/maximum $L_1$ or $L_2$ with thresholds, in addition to the determination values $\Delta_0$, $\Delta_{0.5}$ and $\Delta_1$. It is further possible to use the minimum/maximum $L_1$ or $L_2$, $L_{e1}$, $L_{e2}$ in the different or same positions at which the code bits differ in hard decision results or SCR.

In the above-described second embodiment, the decoding device which performs turbo decoding using the decoding results in the two decoder or the two stages of decoding process is described. However, a decoding device may include three or more decoders or may have three or more stages of decoding functions. In such a case, if the number of decoders=M, with the use of Expression 2, the determination value $\Delta$ can be calculated using a part or all of the results of the first and the second decoders, the results of the second and the third decoders, . . . , the results of the (M−1)th and the Mth decoders. This enables the stop determination with more precise units, not with a unit of iterative decoding, to thereby stop the process with a minimum iterative number.

Although convergence/non-convergence is determined using two thresholds in the above-described embodiments, it is possible to determine only convergence, for example. Further, the thresholds $\eta_{conv}$ or $\eta_{non-conv}$ may be constant numbers or variable numbers which vary with the iterative number. In such a case, the value may be calculated appropriately by function or stored in a look-up table or the like.

Further, in the second embodiment which enables convergence/non-convergence determination with short intervals, it is possible to perform CRC determination after the stop determination and upon detecting CRC error, it is possible to perform the iterative decoding again.

In addition, although the first to third embodiments are described as hardware configuration, the present invention may be implemented by executing a computer program on a CPU (Central Processing Unit) to thereby perform arbitrary processing. In such a case, a computer program may be stored in a recording medium or may be transmitted through a transmission medium such as the Internet.

It is apparent that the present invention is not limited to the above embodiment that may be modified and changed without departing from the scope and spirit of the invention.

What is claimed is:

1. A decoding device that decodes received data based on likelihood information, comprising:
   a decoding processor configured to perform iterative decoding on each of a plurality of blocks divided from the received data; and
   a stop/end determination section configured to determine whether or not to stop the iterative decoding in each divided block based on an output result from the decoding processor and to perform end determination determining whether or not to end decoding process of the received data based on a stop determination result,
   wherein upon the decoding processor terminating the iterative decoding on one of the blocks divided from the received data, the stop/end determination section performs the end determination to determine whether the iterative decoding on the one of the blocks is converged or not, and
   the decoding processor continues the iterative decoding for another one of the blocks divided from the received data upon the stop/end determination section determining that the iterative decoding on the one of the blocks is converged,
   whereas the decoding processor does not decode all of remaining blocks upon the stop/end determination section determining that the iterative decoding on the one of the blocks is not converged.

2. The decoding device according to claim 1, wherein the stop/end determination section performs the end determination upon completion of the iterative decoding in each divided block and, when the stop determination determines that error correction of the iterative decoding in one divided block is not converged, ends the decoding process of the received data.

3. The decoding device according to claim 1, wherein the divided block is a code block as a decoding unit, and the received data is a transport block containing a plurality of code blocks.

4. The decoding device according to claim 1, wherein an error detecting code is added to a final block in the received data.

5. The decoding device according to claim 1, wherein the decoding processor functions as a plurality of stages of decoders and completes one-time iterative decoding by executing a first to a final stages of decoding process, and the stop/end determination section performs the stop determination at a timing of completion of decoding process before the final stage.

6. The decoding device according to claim 5, wherein the stop/end determination section performs the stop determination at a timing of completion of each decoding process in the plurality of stages of decoding process.

7. The decoding device according to claim 5, wherein the decoding processor includes a plurality of stages of decoders, and the stop/end determination section performs the stop determination based on decoding results in previous and subsequent decoders of the plurality of stages of decoders.

8. The decoding device according to claim 5, wherein the decoding processor includes a first decoder and a second decoder, and the stop/end determination section performs the stop determination based on an output from the first decoder in current iterative decoding and an output from the second decoder in previous iterative decoding.

9. The decoding device according to claim 5, further comprising:
a controller controlling the decoding processor, wherein the decoding processor includes one decoder to function as a first decoder and a second decoder, and the controller switches an input to the one decoder such that the one decoder functions as the first decoder or the second decoder.

10. The decoding device according to claim 8, further comprising:
a hard decision section outputting a hard decision decoding result based on an output result from the decoding processor, wherein the stop/end determination section performs the stop determination based on a result of the hard decision section by calculating a determination value corresponding to the number of differences in hard decision results based on an output from the first decoder in current iterative decoding and an output from the second decoder in previous iterative decoding and detecting convergence/non-convergence using the determination value, and performs the end determination based on a result of the stop determination.

11. The decoding device according to claim 8, wherein the stop/end determination section performs the stop determination based on outputs of the first decoder and the second decoder in current iterative decoding and previous iterative decoding.

12. The decoding device according to claim 8, wherein the stop/end determination section performs the stop determination based on outputs of the first decoder and the second decoder in current iterative decoding.

13. The decoding device according to claim 1, further comprising:
a hard decision section outputting a hard decision decoding result based on an output result from the decoding processor, wherein the stop/end determination section performs the stop determination based on a result of the hard decision section.

14. A decoding method, comprising:
performing an iterative decoding on one of a plurality of blocks divided from a received data for decoding the received data;
performing stop determination determining whether or not to stop the iterative decoding on the one of the blocks divided from the received data;
performing end determination to determine whether the iterative decoding on the one of the blocks is converged or not upon the iterative decoding of the one of the blocks being terminated; and
continuing the decoding of the received data to perform an iterative decoding on another one of the blocks divided from the received data upon the iterative decoding of the one of the blocks being converged,
wherein upon iterative decoding of the one of the blocks being not converged, decoding of all of remaining blocks is not performed.

15. The decoding method according to claim 14, further comprising:
outputting a hard decision decoding result based on a result of the iterative decoding on the one of the blocks,
wherein the stop determination determines whether of the iterative decoding on the one of the blocks is converged or not based on the hard decision decoding result.

16. A receiving apparatus that receives concatenated codes and performs iterative decoding of received data based on likelihood information, comprising:
a receiver receiving the received data;
a decoder performing the iterative decoding of the received data; and
a controller performing end determination determining whether or not to end decoding process of the received data based on a stop determination result upon completion of iterative decoding in one divided block of a plurality of blocks divided from the received data to optimize the number of times of iteration in the decoder, the decoder including:
a decoding processor performing iterative decoding on each of the divided blocks; and
a stop/end determination section determining whether or not to stop the iterative decoding in each divided block based on an output result from the decoding processor,
wherein upon the decoding processor terminating the iterative decoding on one of the blocks divided from the received data, the controller performs the end determination to determine whether the iterative decoding on the one of the blocks is converged or not, and
the decoding processor continues the iterative decoding for another one of the blocks divided from the received data upon the controller determining that the iterative decoding on the one of the block is converged,
whereas the decoding processor does not decode all of remaining blocks upon the stop/end determination section determining that the iterative decoding on the one of the blocks is not converged.

* * * * *